(12) United States Patent
Wakatsuki et al.

(10) Patent No.: US 9,570,464 B1
(45) Date of Patent: Feb. 14, 2017

(54) METHOD FOR MANUFACTURING SEMICONDUCTOR DEVICE

(71) Applicant: KABUSHIKI KAISHA TOSHIBA, Tokyo (JP)

(72) Inventors: Satoshi Wakatsuki, Mie (JP); Atsuko Sakata, Mie (JP); Masayuki Kitamura, Mie (JP); Daisuke Ikeno, Mie (JP); Takeshi Ishizaki, Aichi (JP); Tomotaka Ariga, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/074,563

(22) Filed: Mar. 18, 2016

Related U.S. Application Data

(60) Provisional application No. 62/267,425, filed on Dec. 15, 2015.

(51) Int. Cl.
| | | |
|---|---|---|
| H01L 21/8239 | (2006.01) | |
| H01L 27/115 | (2006.01) | |
| H01L 21/311 | (2006.01) | |
| H01L 21/02 | (2006.01) | |
| H01L 21/768 | (2006.01) | |
| H01L 29/66 | (2006.01) | |
| H01L 29/49 | (2006.01) | |

(Continued)

(52) U.S. Cl.
CPC ..... *H01L 27/11582* (2013.01); *H01L 21/0217* (2013.01); *H01L 21/02164* (2013.01); *H01L 21/31111* (2013.01); *H01L 21/764* (2013.01); *H01L 21/765* (2013.01); *H01L 21/76841* (2013.01); *H01L 27/11556* (2013.01); *H01L 27/11568* (2013.01); *H01L 29/4991* (2013.01); *H01L 29/66666* (2013.01)

(58) Field of Classification Search
CPC ............ H01L 27/11582; H01L 21/3111; H01L 21/0217; H01L 21/02164; H01L 21/76841; H01L 29/66666; H01L 29/4991; H01L 21/765; H01L 21/01; H01L 21/764; H01L 27/11568; H01L 27/11556
See application file for complete search history.

(56) References Cited

U.S. PATENT DOCUMENTS 7,847,334 B2 * 12/2010 Katsumata ............ H01L 21/764
257/314
8,178,917 B2 5/2012 Tanaka et al.
(Continued)

FOREIGN PATENT DOCUMENTS

JP 2011-60958 3/2011

*Primary Examiner* — Savitr Mulpuri
(74) *Attorney, Agent, or Firm* — Finnegan, Henderson, Farabow, Garrett & Dunner LLP

(57) ABSTRACT

According to one embodiment, a method for manufacturing a semiconductor device includes forming a first metal nitride film on a side surface of a hole extending in a stacking direction in a stacked body. The method includes forming a second metal nitride film on upper and lower surfaces of second layers and a side surface of the first metal nitride film. The method includes forming metal layers in first air gaps inside the second metal nitride film. The method includes removing the second layers and forming second air gaps between the metal layers. The method includes removing the first metal nitride film exposed to the second air gaps and dividing the first metal nitride film in the stacking direction.

20 Claims, 29 Drawing Sheets

(51) Int. Cl.
  *H01L 21/765* (2006.01)
  *H01L 21/764* (2006.01)

(56) References Cited

U.S. PATENT DOCUMENTS

| | | | |
|---|---|---|---|
| 8,184,789 B2* | 5/2012 | Ryskamp | H04M 3/2281 |
| | | | 379/201.1 |
| 8,378,406 B2 | 2/2013 | Katsumata et al. | |
| 8,643,081 B2* | 2/2014 | Fujiwara | H01L 29/792 |
| | | | 257/321 |
| 8,728,919 B2* | 5/2014 | Kito | H01L 27/11551 |
| | | | 257/296 |
| 8,779,499 B2* | 7/2014 | Kiyotoshi | H01L 27/11524 |
| | | | 257/319 |
| 8,809,931 B2* | 8/2014 | Nakai | H01L 29/788 |
| | | | 257/314 |
| 8,896,051 B2 | 11/2014 | Nansei | |
| 9,379,165 B2* | 6/2016 | Yoshida | H01L 27/249 |
| 9,406,694 B1* | 8/2016 | Ikeno | H01L 27/11582 |
| 2010/0163968 A1* | 7/2010 | Kim | H01L 27/11582 |
| | | | 257/324 |
| 2015/0243675 A1* | 8/2015 | Lim | H01L 27/11556 |
| | | | 257/324 |

* cited by examiner

METHOD FOR MANUFACTURING SEMICONDUCTOR DEVICE

CROSS-REFERENCE TO RELATED APPLICATION

This application is based upon and claims the benefit of priority from U.S. Provisional Patent Application 62/267,425, filed on Dec. 15, 2015; the entire contents of which are incorporated herein by reference.

FIELD

Embodiments described herein relate generally to a method for manufacturing a semiconductor device.

BACKGROUND

A method for manufacturing a three-dimensional memory device is proposed. The method includes replacing a sacrifice layer with a metal layer after forming a columnar section including a charge storage film and a semiconductor body in a stacked body. The stacked body includes an insulating layer and the sacrifice layer alternately stacked. In such a replace process, a method is also proposed, forming a metal layer via a metal nitride film on an inner surface of an air gap between insulating layers formed by removing the sacrifice layer. With increase of the metal nitride film thickness, the metal layer thickness becomes thin relatively. The metal nitride film is provided also between the columnar section and the metal layer, and functions as a barrier metal. The barrier metal is required to have a thickness sufficient for diffusion prevention of elements contained in the metal layer to the columnar section.

DETAILED DESCRIPTION

According to one embodiment, a method for manufacturing a semiconductor device includes forming a stacked body above a substrate. The stacked body includes a plurality of first layers and a plurality of second layers. The first layers and the second layers include a first layer and a second layer alternately stacked. The method includes forming a first metal nitride film on a side surface of a hole extending in a stacking direction in the stacked body. The method includes forming a stacked film including a charge storage portion on a side surface of the first metal nitride film. The method includes forming a semiconductor body on a side surface of the stacked film. The method includes removing the first layers and forming a plurality of first air gaps between the second layers. The method includes forming a second metal nitride film on upper and lower surfaces of the second layers and a side surface of the first metal nitride film. The upper and lower surfaces of the second layers and the side surface of the first metal nitride film are exposed to the first air gaps. The method includes forming a plurality of metal layers in the first air gaps inside the second metal nitride film. The method includes removing the second layers and forming a plurality of second air gaps between the metal layers. The method includes removing the first metal nitride film exposed to the second air gaps and dividing the first metal nitride film in the stacking direction.

In an embodiment, as a semiconductor device, a semiconductor memory device having a three-dimensional structure memory cell array will be described.

Figure 1:
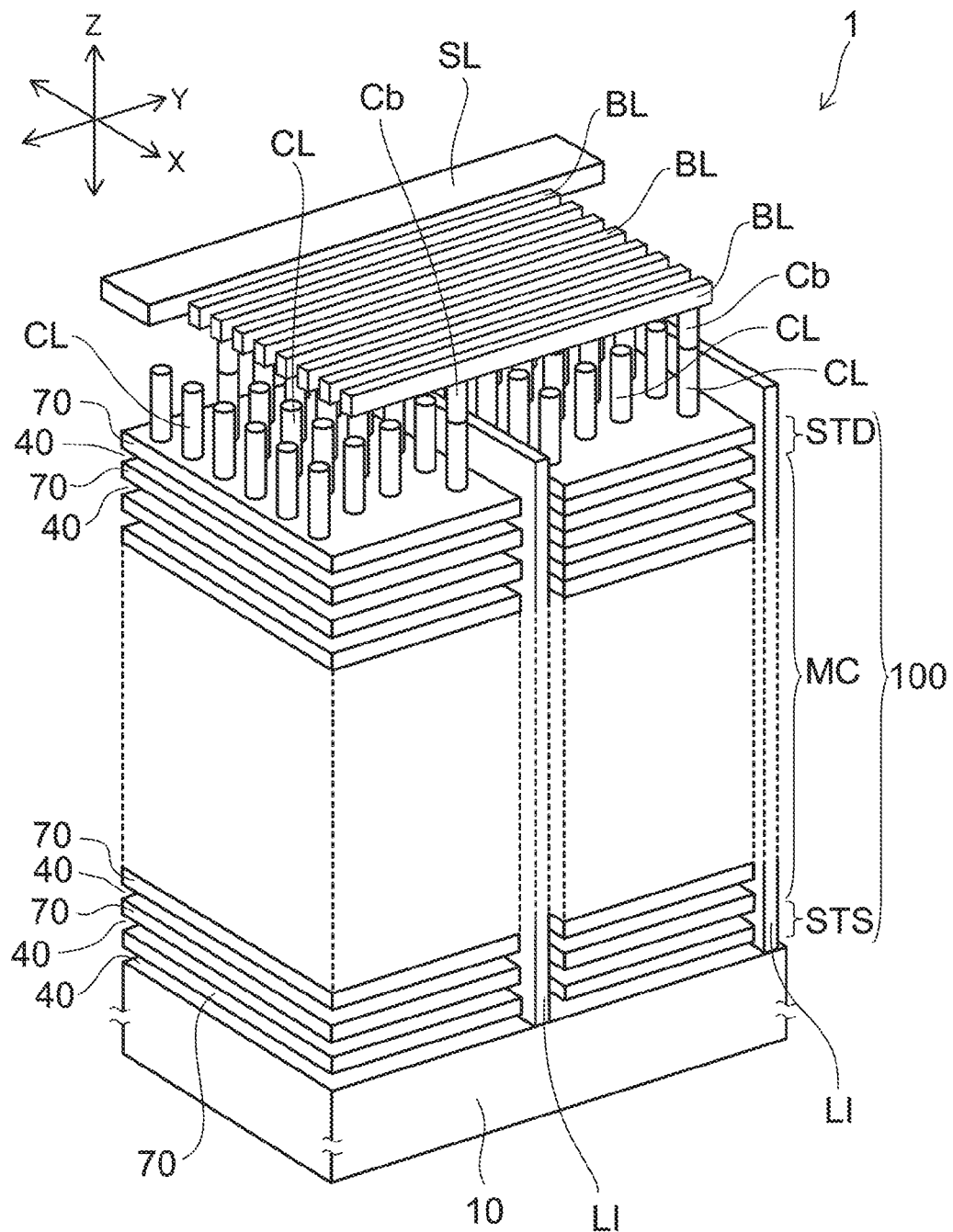
FIG. 1 is a schematic perspective view of a memory cell array of an embodiment.

FIG. 1 is a schematic perspective view of a memory cell array 1 of the embodiment.

In FIG. 1, two directions parallel to a major surface of a substrate 10 and orthogonal each other are taken as an X-direction and a Y-direction, and a direction orthogonal to both of the X-direction and the Y-direction is taken as a Z-direction (stacking direction).

The memory cell array 1 includes the substrate 10, a stacked body 100 provided on the major surface of the substrate 10, a plurality of columnar sections CL, a plurality of interconnect sections LI, and an upper layer interconnect provided above the stacked body 100. FIG. 1 shows, for example, a bit line BL and a source line SL as the upper layer interconnect.

The columnar sections CL are formed in a cylinder form or an elliptical cylinder form extending along a stacking direction (Z-direction) in the stacked body 100. The interconnect sections LI extend in the stacking direction (Z-direction) of the stacked body 100 and the X-direction, and separate the stacked body 100 into a plurality of blocks in the Y-direction.

The plurality of columnar sections CL are arranged, for example, in a staggered arrangement. Alternatively, the plurality of columnar sections CL may be arranged in a square lattice along the X-direction and the Y-direction.

The plurality of bit lines BL are provided above the stacked body 100. The plurality of bit lines BL are, for example, metal films extending in the Y-direction. The plurality of bit lines BL are mutually separated in the X-direction.

An upper end of the columnar section CL is connected to the bit line BL via a contact portion Cb. The plurality of columnar sections CL, each of which is selected from each of blocks separated in the Y-direction by the interconnect sections LI, are connected to one common bit line BL.

Figure 2:
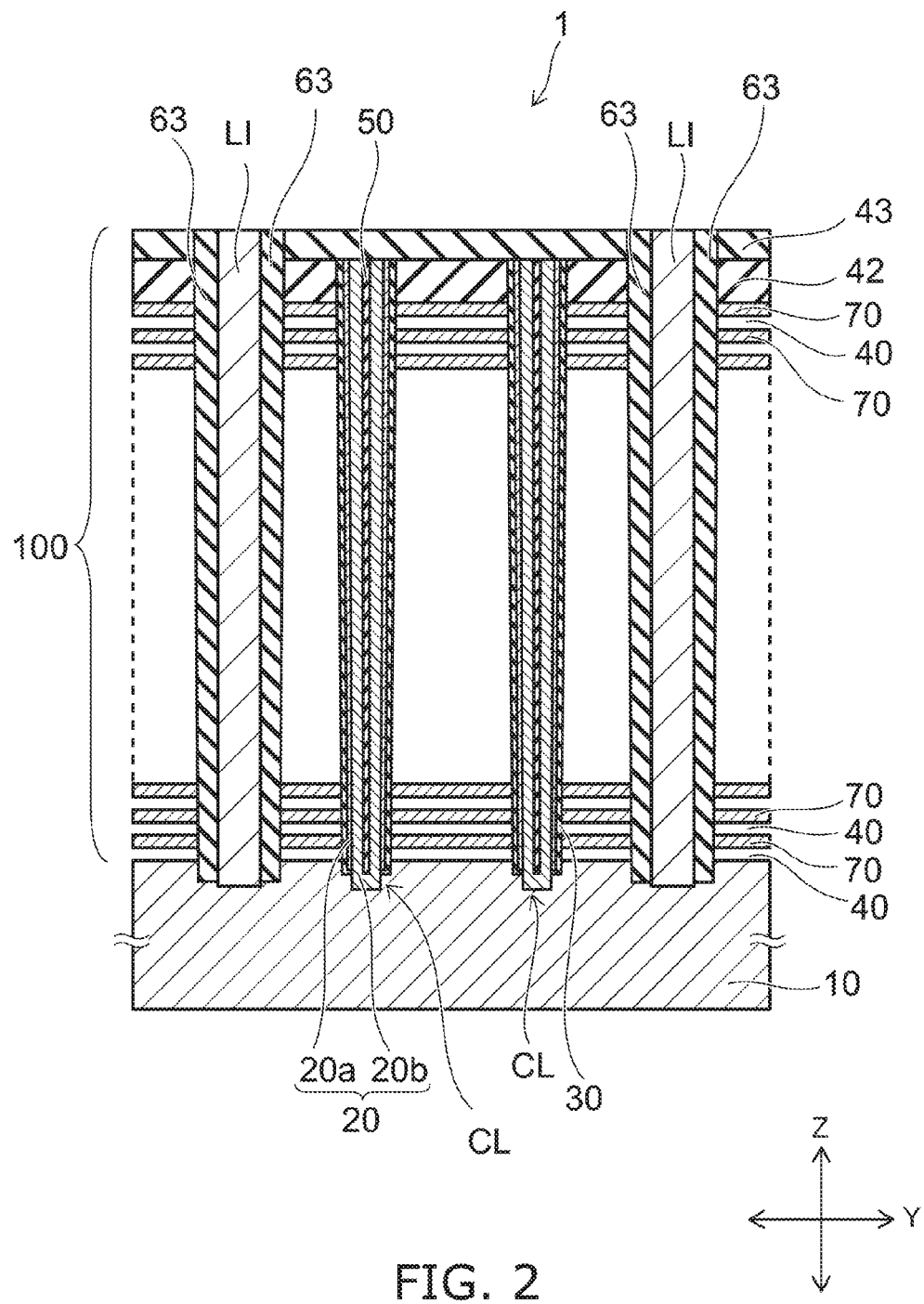
FIG. 2 is a schematic cross-sectional view of the memory cell array of the embodiment.

FIG. 2 is a schematic cross-sectional view of the memory cell array 1.

The stacked body 100 includes a plurality of metal layers 70 stacked on the major surface of the substrate 10. The plurality of metal layers 70 are stacked in a direction (Z-direction) perpendicular to the major surface of the substrate 10, with air gaps 40 interposed. The metal layers 70 are, for example, tungsten layers or molybdenum layers.

The air gap 40 is also provided between the major surface of the substrate 10 and the metal layer 70 of the lowermost layer. An insulating film 42 is provided on the metal layer 70 of the uppermost layer, and an insulating film 43 is provided on the insulating film 42.

Figure 3:
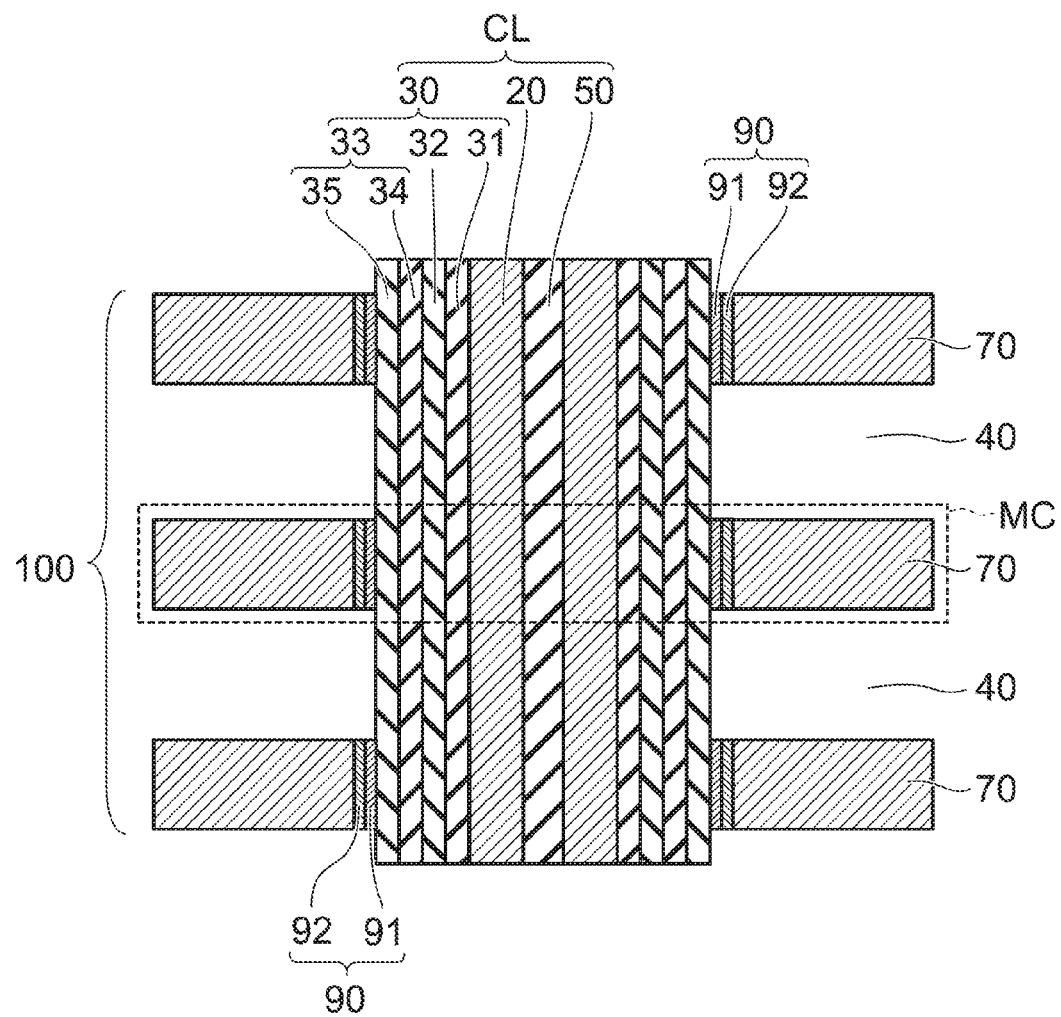
FIG. 3 is a schematic cross-sectional view of a memory cell of the embodiment.

FIG. 3 is an enlarged cross-sectional view of a portion in FIG. 2.

The columnar section CL includes a memory film 30, a semiconductor body 20 and an insulative core film 50. The semiconductor body 20, the memory film 30 and the core film 50 extend continuously along the stacking direction of the stacked body 100.

The semiconductor body 20 extends in a pipe form along the stacking direction (Z-direction) in the stacked body 100. The memory film 30 is provided between the metal layer 70 and the semiconductor body 20, and surrounds the semiconductor body 20 from the outer peripheral side. The core film 50 is provided inside the pipe-formed semiconductor body 20. An upper end of the semiconductor body 20 is electrically connected to the bit line BL via the contact portion Cb shown in FIG. 1.

The memory film 30 is a stacked film including a tunnel insulating film 31, a charge storage film (charge storage portion) 32 and a block insulating film 33. The block insulating film 33, the charge storage film 32 and the tunnel insulating film 31 are provided in order from the metal layer 70 side, between the metal layer 70 and the semiconductor body 20. The tunnel insulating film 31 contacts the semiconductor body 20. The charge storage film 32 is provided between the block insulating film 33 and the tunnel insulating film 31.

A metal nitride film 90 is provided between the metal layer 70 and the columnar section CL. The metal nitride film 90 is divided in the stacking direction of the stacked body 100 and is not connected in the stacking direction. Therefore, the plurality of metal layers 70 are not shorted via the metal nitride film 90. In FIG. 2, the metal nitride film 90 is not shown.

The metal layer 70 surrounds the columnar section CL from the outer peripheral side via the metal nitride film 90. Between an inner peripheral surface of the metal layer 70 and an outer peripheral surface of the semiconductor body 20, the metal nitride film 90 and the memory film 30 are provided continuously in a direction connecting the above inner peripheral surface and the above outer peripheral surface. The plurality of metal layers 70 stacked with the air gaps 40 are connected physically to the columnar section CL via the metal nitride film 90 and the memory film 30, and supported by the columnar section CL.

The semiconductor body 20, the memory film 30 and the metal layer 70 constitutes a memory cell MC. In FIG. 3, one memory cell MC is shown schematically by a broken line. The memory cell has a vertical transistor structure that a periphery of the semiconductor body 20 is surrounded by the metal layer 70 via the memory film 30.

In the memory cell MC of the vertical transistor structure, the semiconductor body 20 is, for example, a channel body of silicon, and the metal layer 70 functions as a control gate. The charger storage film 32 functions as a data memory layer storing a charge injected from the semiconductor body 20.

The semiconductor memory device of the embodiment is a non-volatile semiconductor memory device capable of erasing/writing data electrically and capable of holding a memory content even after power-off.

The memory cell MC is, for example, a memory cell of charge trap type. The charge storage film 32 has many trap sites trapping charges in an insulative film, and includes, for example, a silicon nitride film. The charge storage film 32 may be a conductive floating gate surrounded by an insulator.

The tunnel insulating film 31 serves as a potential barrier when a charge is injected into the charge storage film 32 from the semiconductor body 20, or a charge stored in the charge storage film 32 is released to the semiconductor body 20. The tunnel insulating film 31 includes, for example, a silicon oxide film.

The block insulating film 33 prevents the charge stored in the charge storage film 32 from being released to the metal layer 70. The block insulating film 33 prevents back tunneling of electrons from the metal layer 70 to the columnar section CL.

The block insulating film 33 includes a first block film 34 and a second block film 35. The first block film 34 contacts the charge storage film 32. The second block film 35 is provided between the first block film 34 and the metal nitride film 90, and contacts the first block film 34 and the metal nitride film 90.

For example, the first block film 34 is a silicon oxide film, and the second block film 35 is a film having a higher dielectric constant than a silicon oxide film. For example, the second block film 35 is a metal oxide film.

As shown in FIG. 1, a drain side selection transistor STD is provided on an upper end of the columnar section CL, and a source side selection transistor STS is provided on a lower end. For example, the lowermost metal layer 70 functions as a control gate of the source side selection transistor STS. For example, the uppermost metal layer 70 functions as a control gate of the drain side selection transistor STD.

A plurality of memory cells MC are provided between the drain side selection transistor STD and the source side selection transistor STS. The memory cells MC, the drain side selection transistor STD, and the source side selection transistor STS are connected in series via the semiconductor body 20, and form one memory string. The memory string is, for example, disposed in a staggered arrangement in a plane direction parallel to the X-Y plane, and the plurality of memory cells MC are provided three-dimensionally in the X-direction, the Y-direction and the Z-direction.

The air gap 40 is formed between the metal layers 70 which are control gates of the adjacent memory cells in the stacking direction. This reduces interconnect capacitance between above and below metal layers 70, and allows high speed operation of the memory cell MC. Furthermore, this suppresses interference between the adjacent cells such as threshold variation due to capacitance coupling between above and below metal layers 70.

As shown in FIG. 3, the metal nitride film 90 provided between the metal layer 70 and the columnar section CL includes a first metal nitride film 91 and a second metal nitride film 92. The first metal nitride film 91 contacts the second block film 35. The second metal nitride film 92 is provided between the first metal nitride film 91 and the metal layer 70, and contacts the first metal nitride film 91 and the metal layer 70.

The first metal nitride film 91 and the second metal nitride film 92 contain at least one of titanium nitride (TiN), titanium silicide nitride (TiSiN), tantalum nitride (TaN), tantalum silicide nitride (TaSiN), tungsten nitride (WN), tungsten silicide nitride (WSiN), molybdenum nitride (MoN), and molybdenum silicide nitride (MoSiN). The first metal nitride film 91 and the second metal nitride film 92 may be films of the same material or film of different materials.

The metal layer 70 is for example, a molybdenum layer or a tungsten layer formed by a CVD method. The metal layer 70 may contain fluorine or boron due to a gas used in the CVD. Diffusion of fluorine or boron into the block insulating film 33 may cause characteristics of the block insulating film 33 to degrade.

The metal nitride film 90 prevents the diffusion of fluorine or boron contained in the metal layer 70 to the block insulating film 33. The metal nitride film 90 improves adhesion between the metal layer 70 and the block insulating film 33.

As shown in FIG. 1 and FIG. 2, the interconnect section LI extends in the Z-direction and the X-direction, and for example, is a film including a metal. An insulating film 63 is provided on a side surface of the interconnect section LI, as shown in FIG. 2. The insulating film 63 is provided between the stacked body 100 and the interconnect section LI.

A lower end of the interconnect section LI contacts the substrate 10. A lower end of the semiconductor body 20 contacts the substrate 10. The substrate 10 is, for example, a silicon substrate doped with an impurity and being conductive. The lower end of the semiconductor body 20 is electrically connectable to the interconnect section LI.

Next, with reference to FIG. 4 to FIG. 20B, a method for manufacturing the semiconductor device of the embodiment will be described. FIG. 16A to FIG. 20B show enlarged cross-section of a portion of the stacked body 100.

Figure 4:
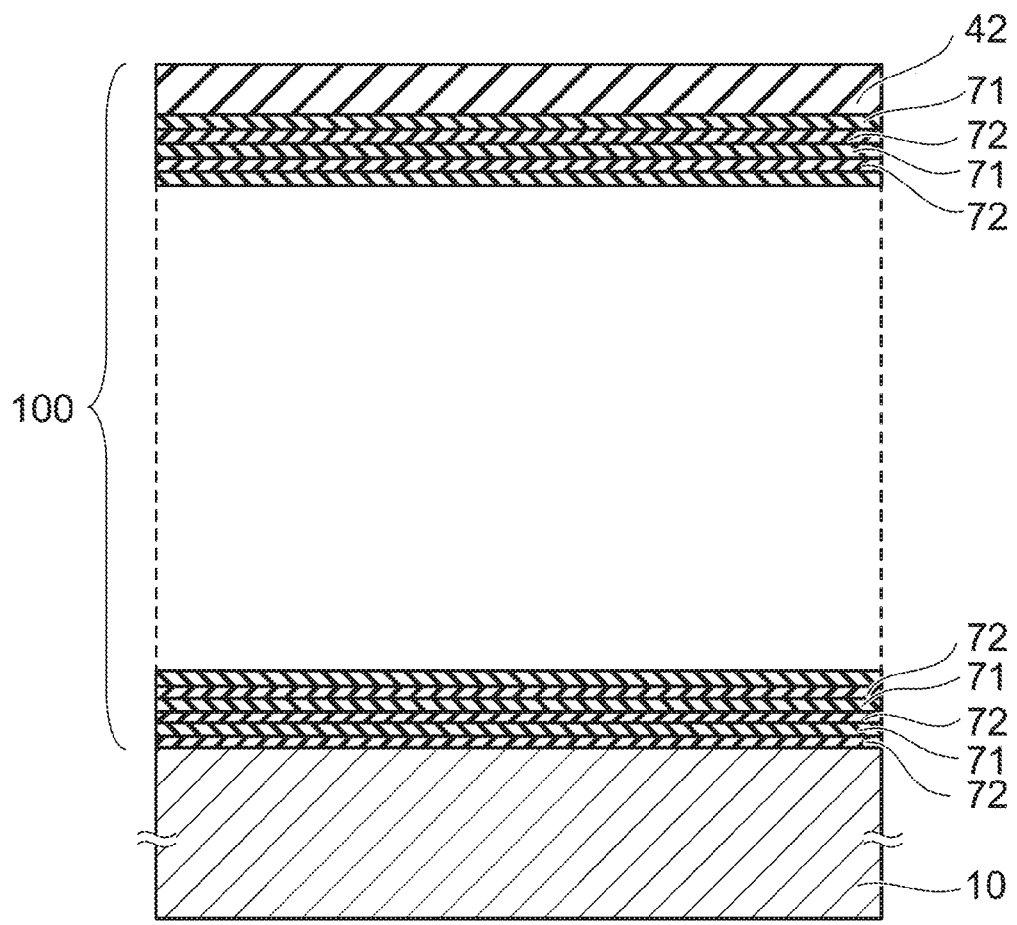
FIG. 4 to FIG. 22B are schematic cross-sectional views showing a method for manufacturing a semiconductor device of the embodiment.

As shown in FIG. 4, the staked body 100 is formed on the substrate 10. A second layer 72 and a first layer 71 are alternately stacked on the major surface of the substrate 10. Process of stacking the second layer 72 and the first layer 71 is repeated, and a plurality of first layers 71 and a plurality of second layers 72 are formed on the substrate 10. For example, the first layer 71 is a silicon nitride layer and the second layer 72 is a silicon oxide layer.

The lowermost second layer 72 is formed on the major surface of the substrate 10, and the lowermost first layer 71 is formed on the lowermost second layer 72. The insulating film 42 is formed on the uppermost first layer 71.

Figure 5:
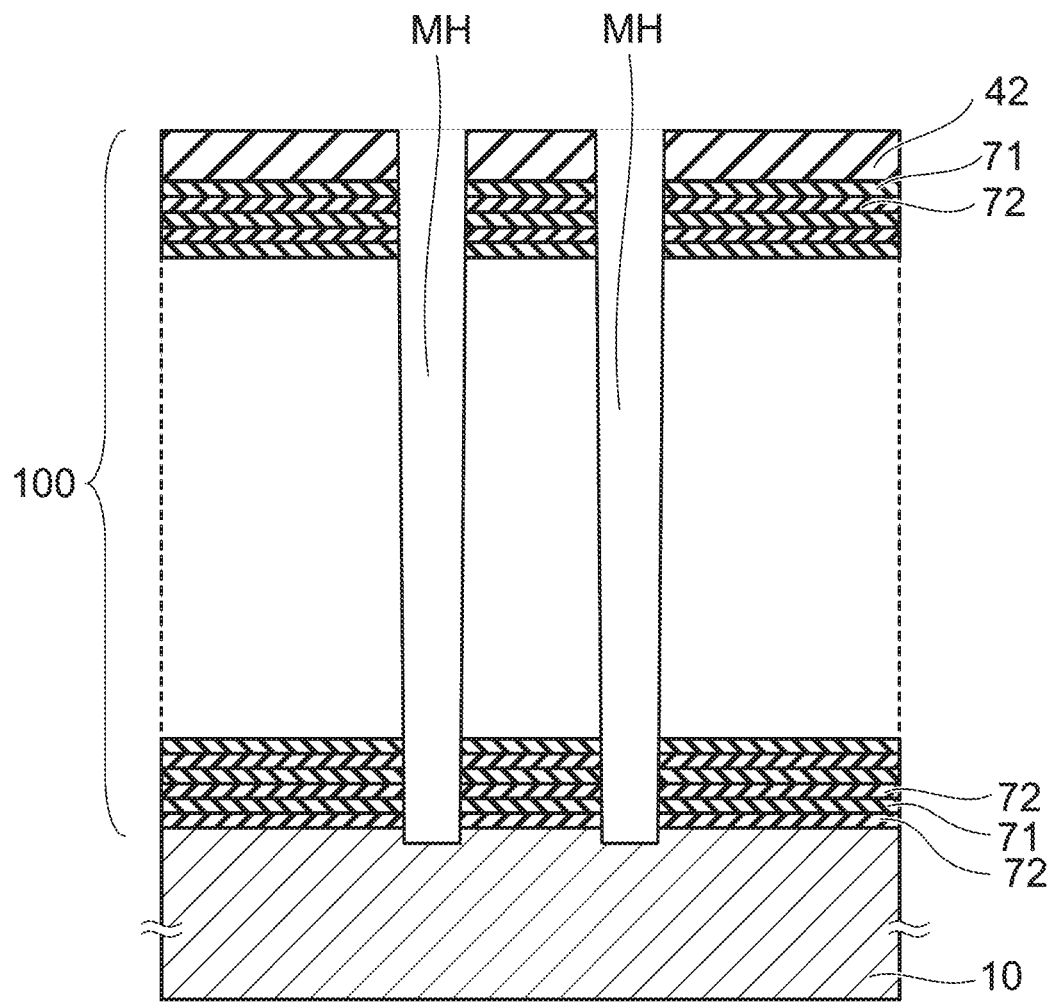

Next, as shown in FIG. 5, a plurality of memory holes MH are formed in the stacked body 100. The memory holes are formed by a reactive ion etching (RIE) method using a mask not shown. The memory holes pierce the stacked body 100 and reach the substrate 10.

Figure 17A:
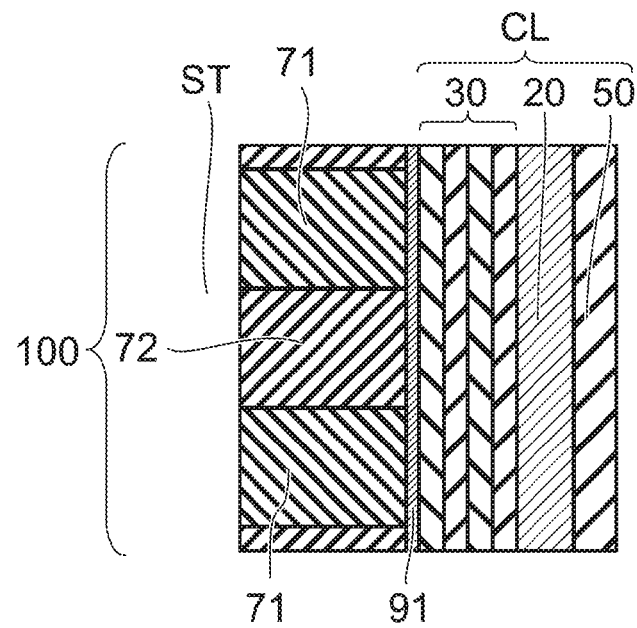

The films of the columnar sections CL are formed in the memory holes via the first metal nitride film 91 as shown in FIG. 17A. In FIG. 6 to FIG. 15, the first metal nitride film 91 is not shown.

Figure 6:
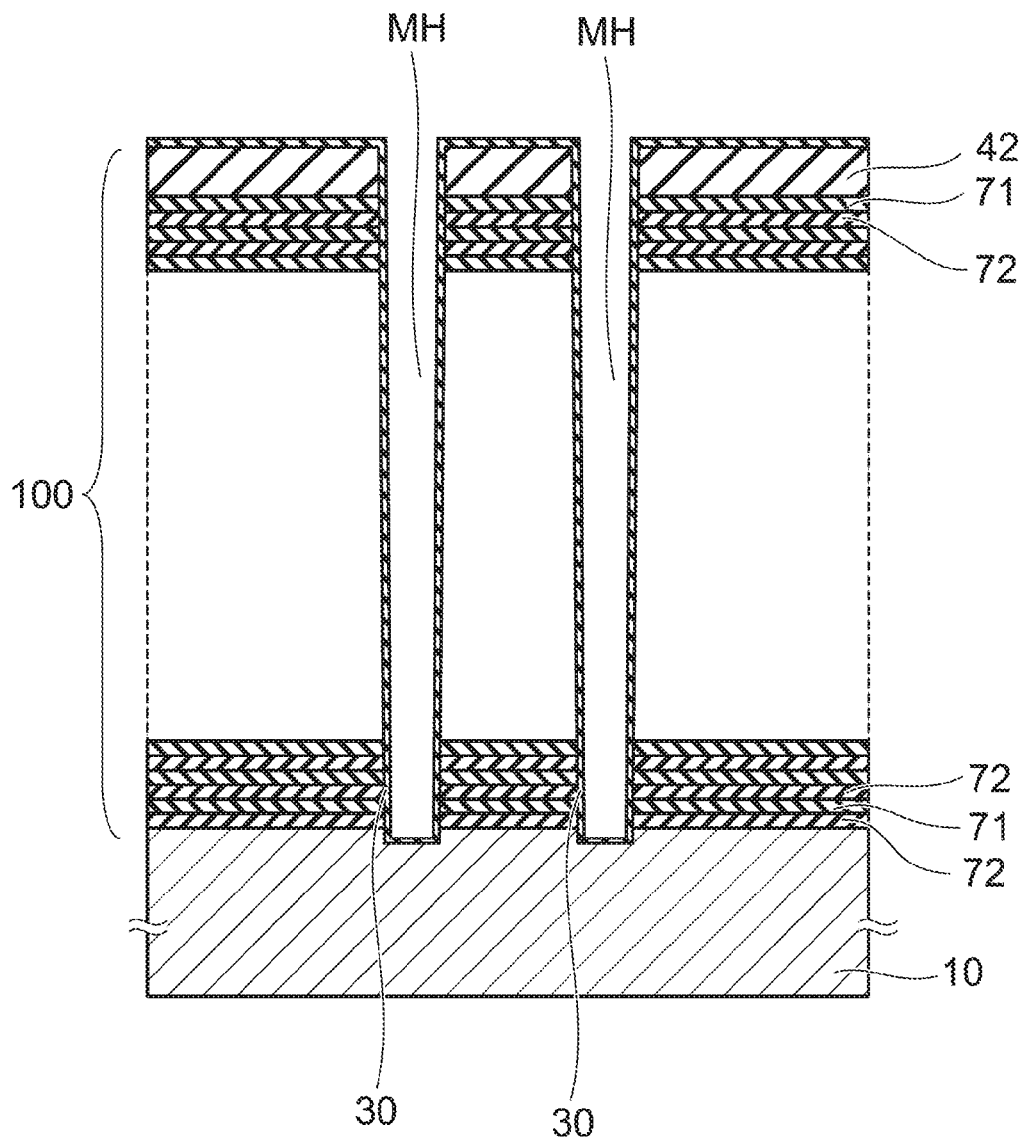
Figure 16A:
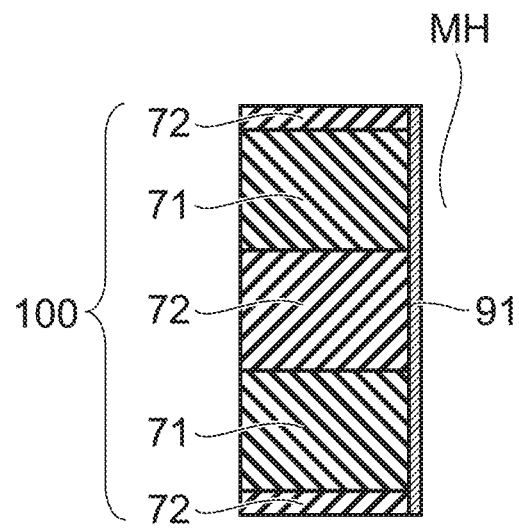
Figure 16B:
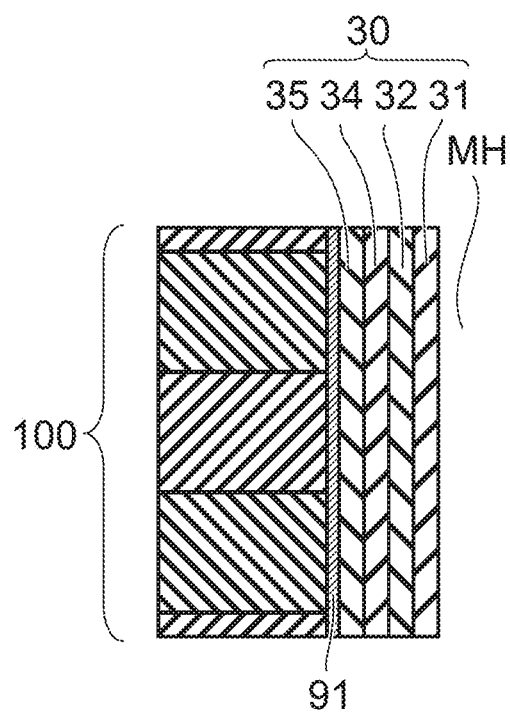

First, as shown in FIG. 16A, the first metal nitride film 91 is formed on a side surface of the memory hole MH. The first metal nitride film 91 is also formed on a bottom of the memory hole MH. The memory film 30 shown in FIG. 6 and FIG. 16B is formed inside the first metal nitride film 91. The memory film 30 is formed in a conformal form along the side surface and the bottom of the memory hole MH.

Figure 7:
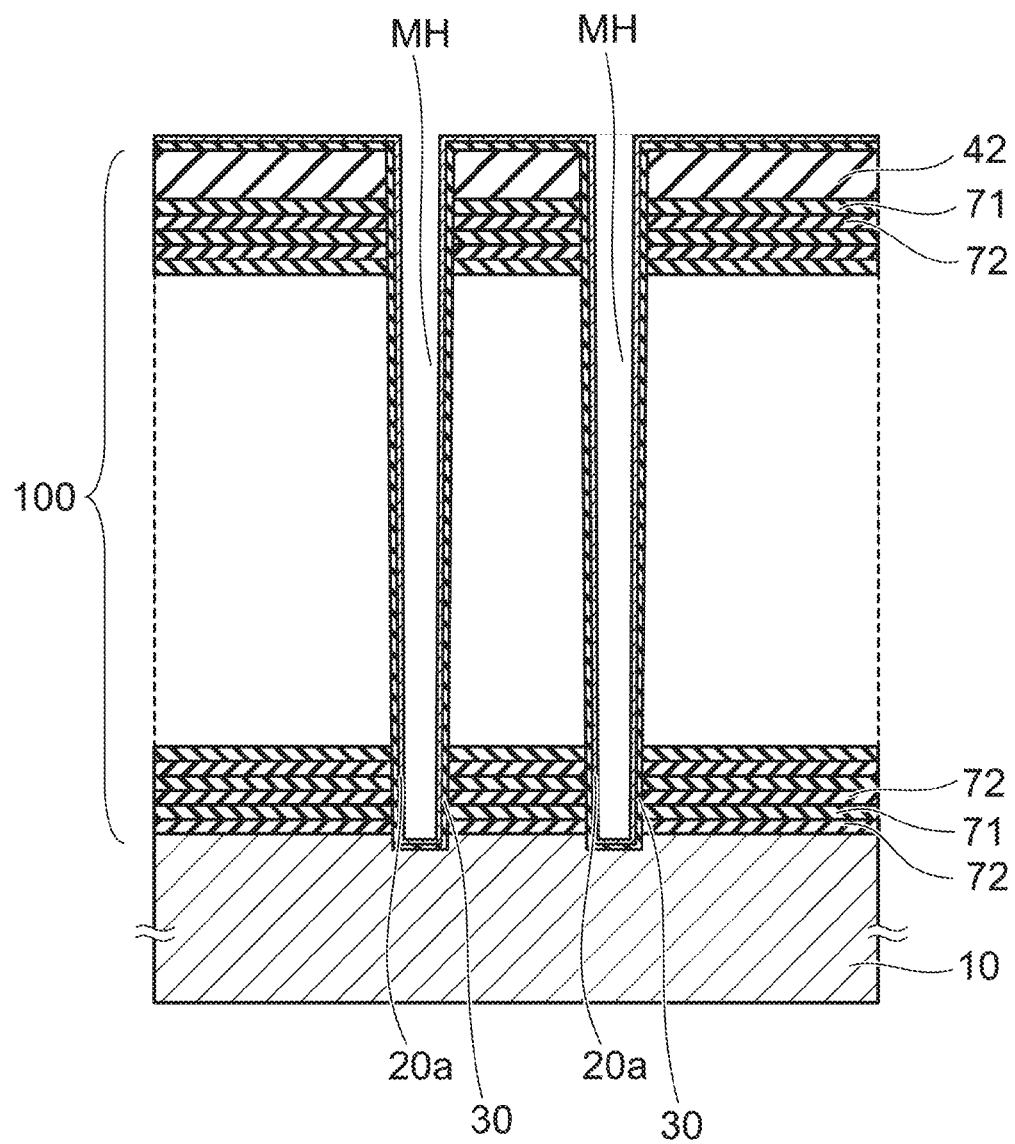

A cover film 20a is formed inside the memory film 30 as shown in FIG. 7. The cover film 20a is formed in a conformal form along the side surface and the bottom of the memory hole MH.

Figure 8:
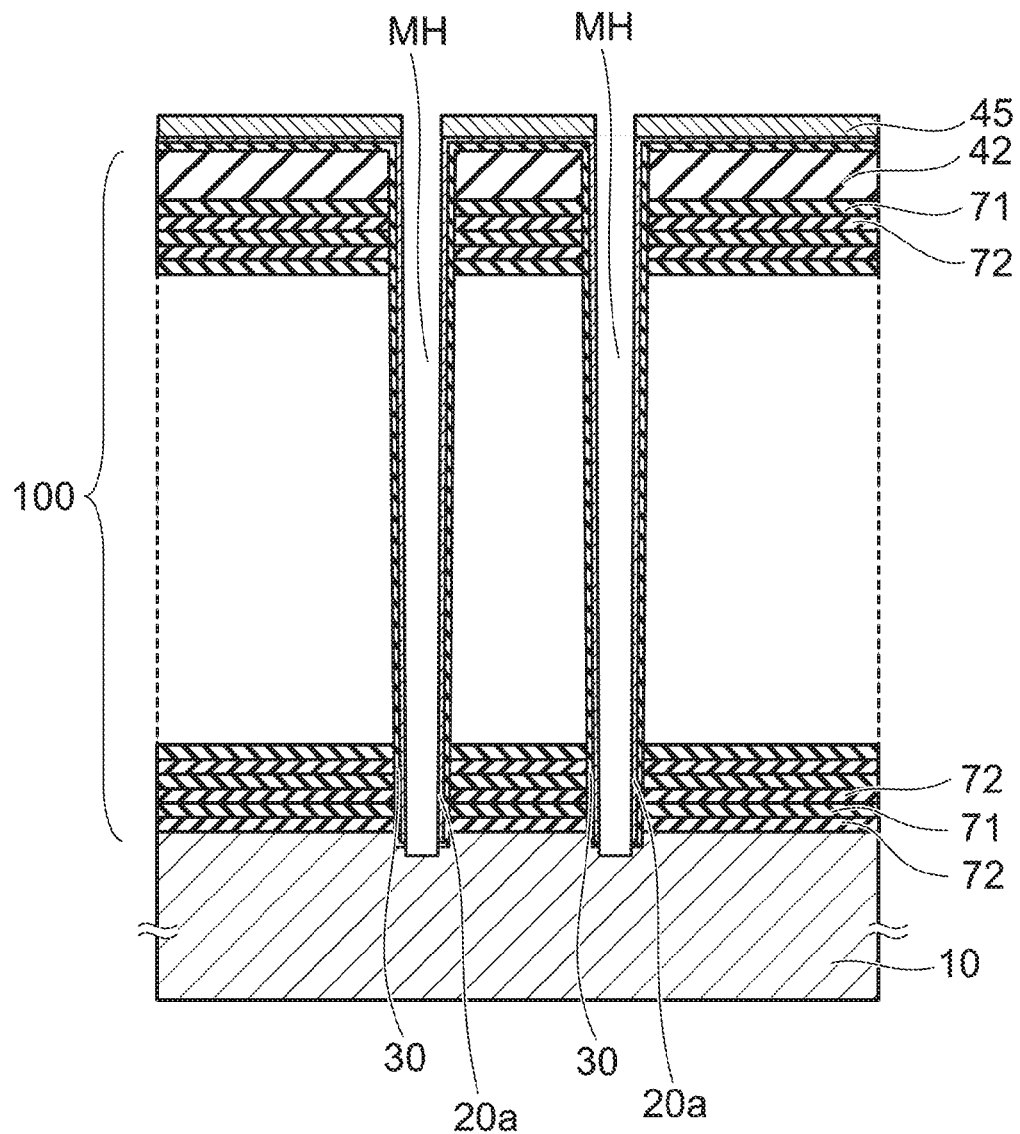

As shown in FIG. 8, a mask layer 45 is formed on an upper surface of the stacked body 100, and the cover film 20a and the memory film 30 and the first metal nitride film 91 deposited on the bottom of the memory hole MH are removed by the RIE method. In the RIE, the memory film 30 formed on the side surface of the memory hole MH is covered with the cover film 20a and not damaged by the RIE.

Figure 9:
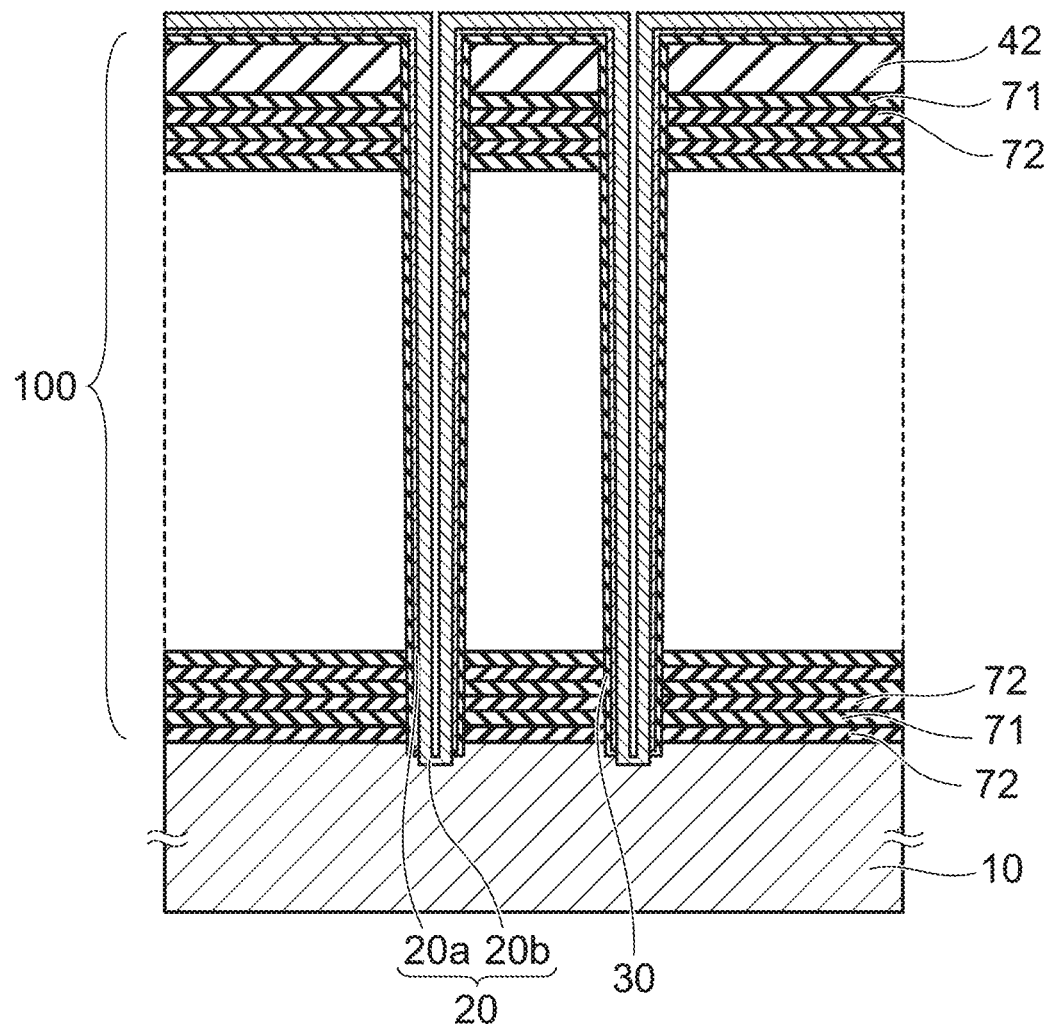

After removing the mask layer 45, as shown in FIG. 9, a semiconductor film 20b is formed in the memory hole MH. The semiconductor film 20b is formed on a side surface of the cover film 20a, and the bottom of the memory hole MH exposing the substrate 10.

The cover film 20a and the semiconductor film 20b are formed as, for example, an amorphous silicon film and then crystallized to a polycrystalline silicon film by heat treatment. The cover film 20a and the semiconductor film 20b constitute the previously described semiconductor body 20.

Figure 10:
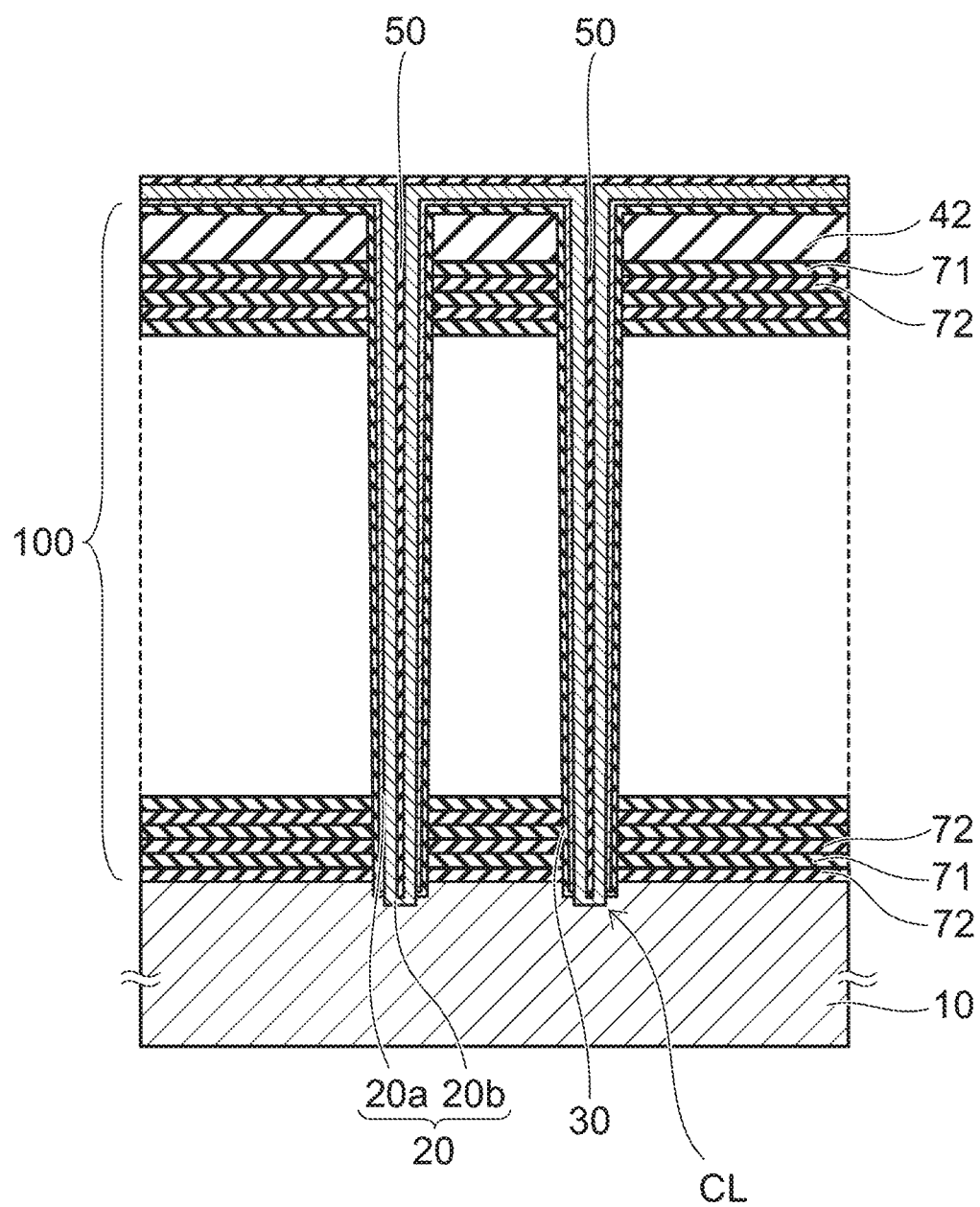

As shown in FIG. 10, a core film 50 is formed inside the semiconductor film 20b. Thereby, as shown in FIG. 10 and FIG. 17A, the columnar section CL is formed.

Figure 11:
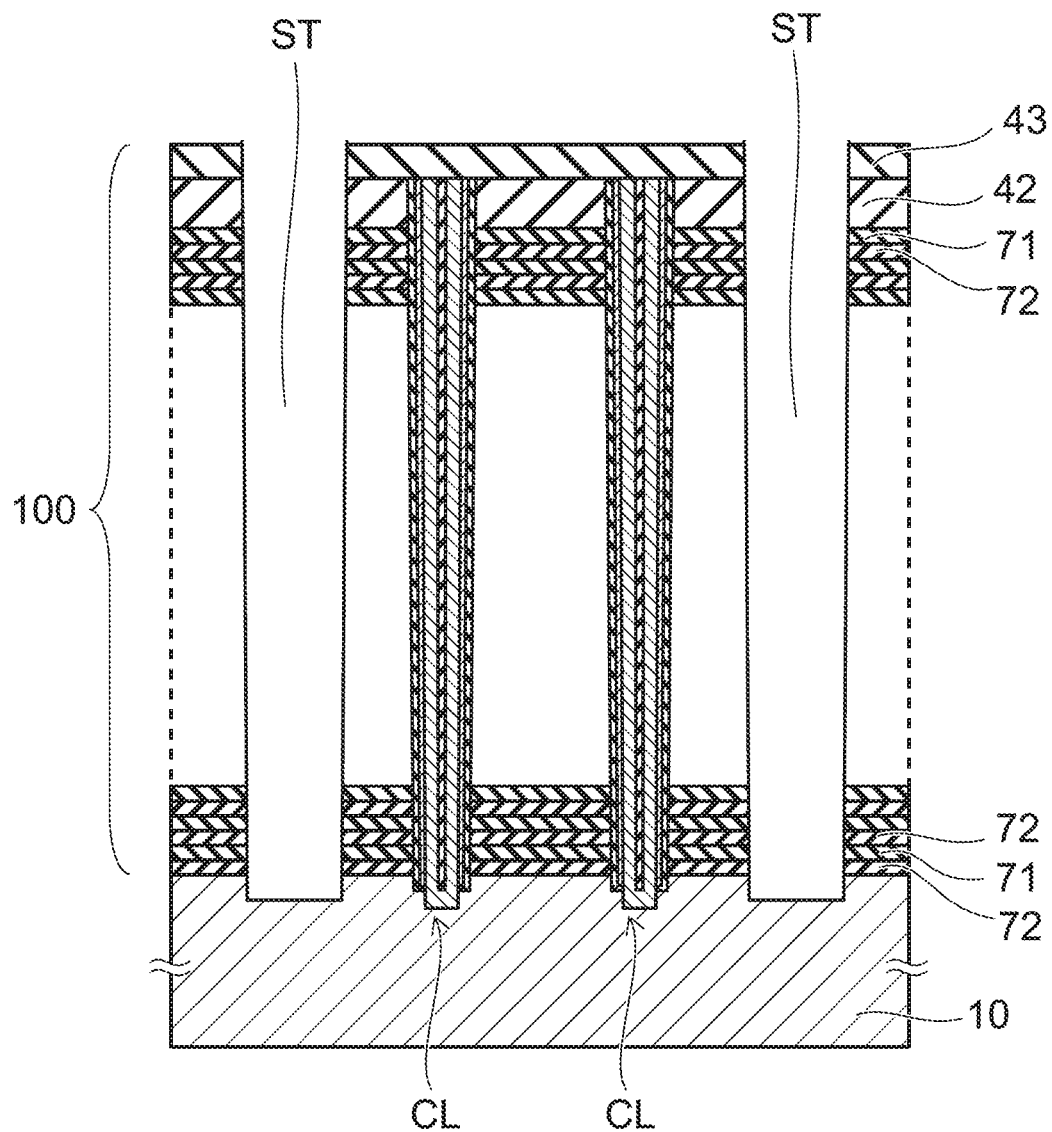

The films deposited on the insulating film 42 shown in FIG. 10 are removed by chemical mechanical polishing (CMP) or etch back. After that, as shown in FIG. 11, the insulating film 43 is formed on the insulating film 42. The insulating film 43 covers an upper end of the columnar section CL.

By RIE method using a mask not shown, a plurality of slits ST are formed in the stacked body 100 including the insulating film 43, the insulating film 42, the first layer 71 and the second layer 72. The slits ST pierces the stacked body 100 and reaches the substrate 10.

Next, the first layer 71 is removed by etching solution or etching gas supplied through the slits ST. For example, the first layer 71 of a silicon nitride layer is removed by etching solution containing phosphoric acid.

Figure 12:
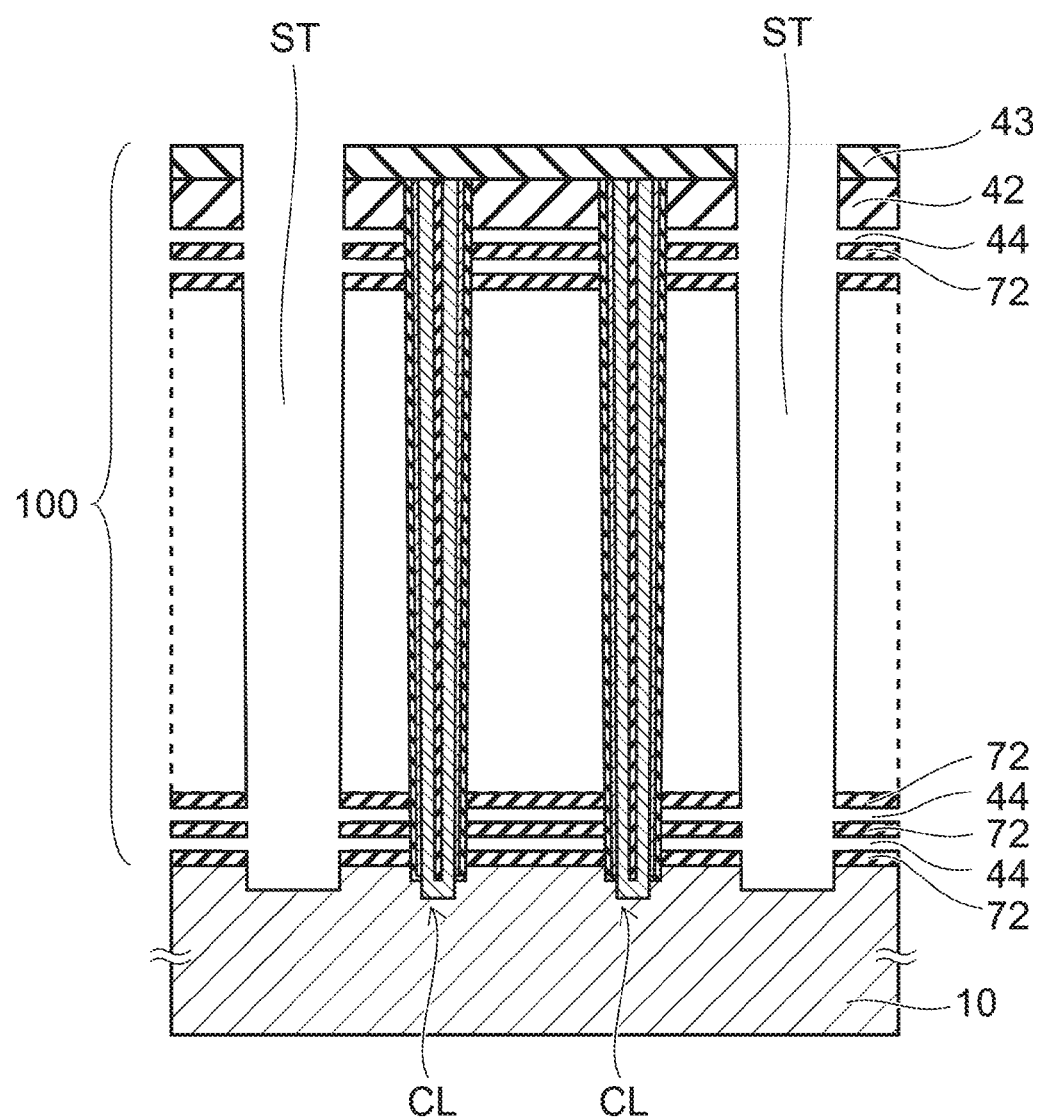
Figure 17B:
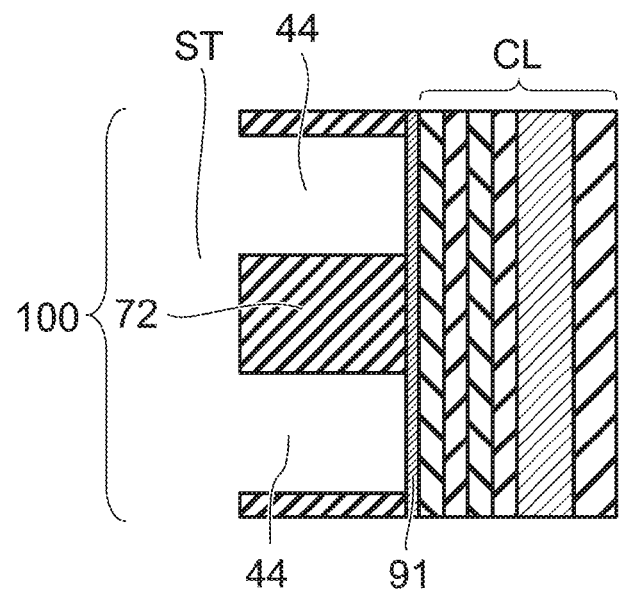

As shown in FIG. 12 and FIG. 17B, an air gap 44 is formed between the second layers 72 adjacent above and below by removing the first layer 71. As shown in FIG. 12, the air gap 44 is also formed between the uppermost second layer 72 and the insulating film 42.

The plurality of second layers 72 stacked with the air gap 44 are supported by the columnar sections CL. A lower end of the columnar section CL is supported by the substrate 10, and an upper end is supported by the insulating film 42 and the insulating film 43.

Figure 18A:
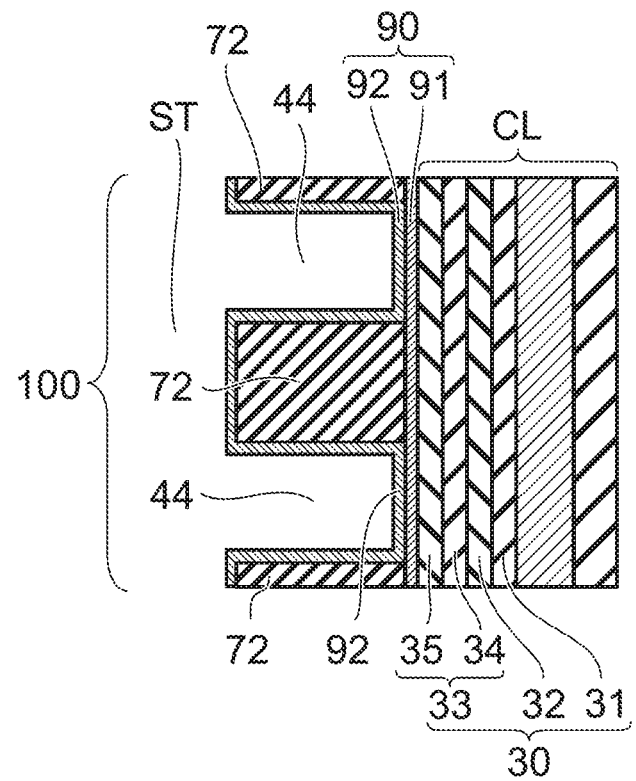

As shown in FIG. 17B, the first metal nitride film 91 is exposed to the air gap 44. Next, as shown in FIG. 18A, the second metal nitride film 92 is formed in the air gap 44. The second metal nitride film 92 is formed on the side surface of the first metal nitride film 91, and the upper surface and lower surface of the second layer 72. The side surface of the first metal nitride film 91, and the upper surface and lower surface of the second layer 72 are exposed to the air gap 44. Furthermore, the second metal nitride film 92 is also formed on the side surface of the second layer 72 exposed to the slit ST. That is, the second metal nitride film 92 is continuously formed in a conformal form along the side surface, the upper surface and the lower surface of the second layer 72, and the side surface of the first metal nitride film 91.

Figure 18B:
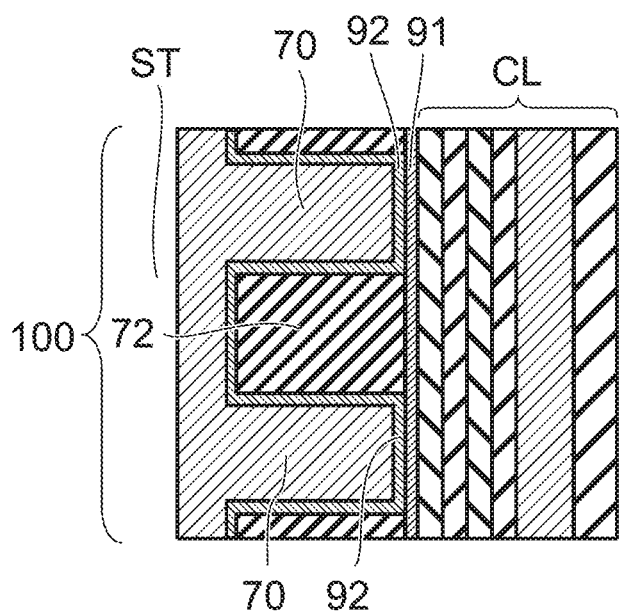

After that, as shown in FIG. 18B, the metal layer 70 is formed in the air gap 44. The metal layer 70 is formed by, for example, a chemical vapor deposition (CVD) method. A source gas is supplied to the air gap 44 through the slit ST, and the metal layer 70 is crystal grown using the second metal nitride layer 92 as a seed layer.

Figure 13:
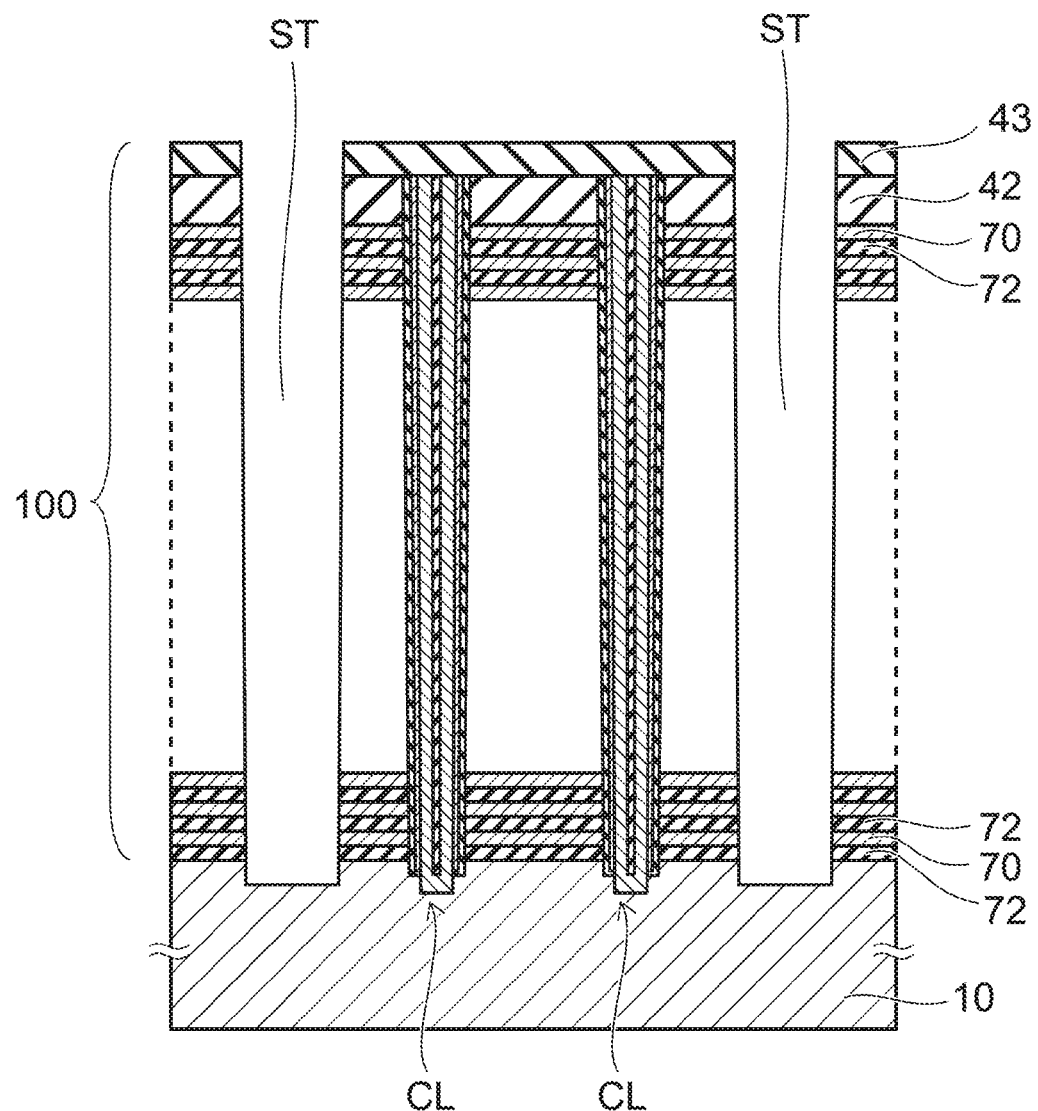

As shown in FIG. 13, the metal layer 70 is formed between the second layers 72 adjacent above and below, and between the uppermost second layer 72 and the insulating film 42.

Figure 19A:
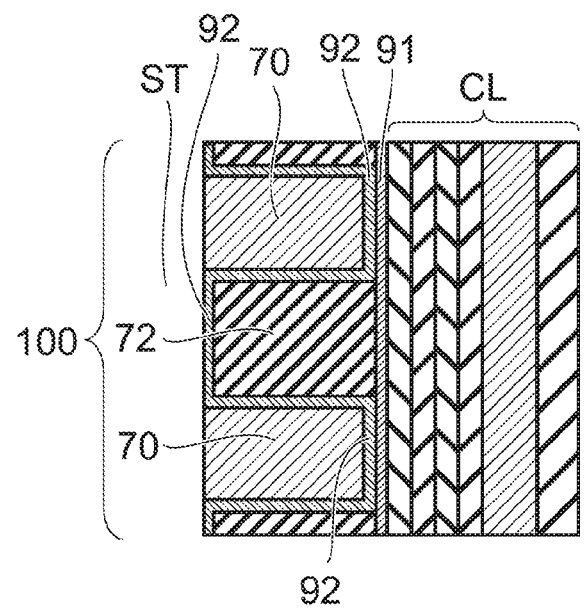

As shown in FIG. 18B, the metal layer 70 is also formed on the side surface of the slit ST. The metal layer 70 formed on the side surface of the slit ST is removed by the etching solution or the etching gas supplied to the slit ST as shown in FIG. 19A. For example, the metal layer 70 of tungsten layer is removed by using a gas containing fluorine ($F_2$ gas, $NF_3$ gas). By removing the metal layer 70, electrical connection between the metal layers 70 adjacent above and below is isolated.

Figure 19B:
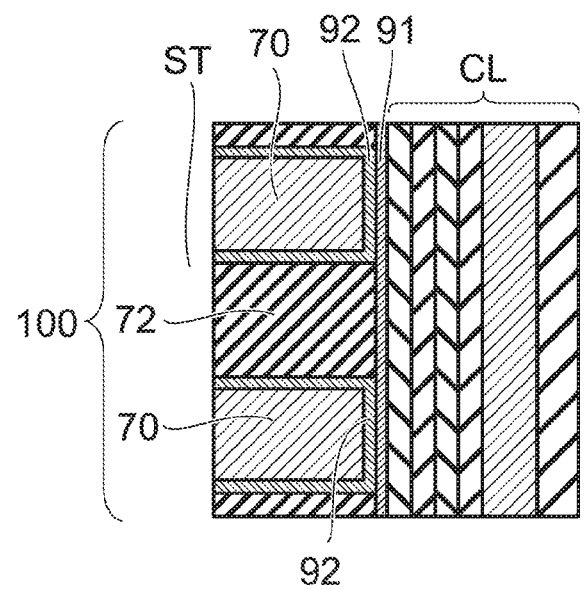

The metal layer 70 on the side surface of the slit ST is removed and the second metal nitride film 92 formed on the side surface of the second layer 72 is exposed to the slit ST. The second metal nitride film 92 on the side surface of the second layer 72 is removed by the etching solution or the etching gas supplied to the slit ST as shown in FIG. 19B. By removing the second metal nitride film 92, electrical connection through the second metal nitride film 92 between the metal layers 70 adjacent above and below is isolated.

The second metal nitride film 92 on the side surface of the second layer 72 is removed and the side surface of the second layer 72 is exposed to the slit ST. Next, the second layer 72 is removed by the etching solution or the etching gas supplied through the slit ST. For example, the second layer 72 of a silicon oxide layer is removed by the etching solution containing hydrofluoric acid.

Figure 14:
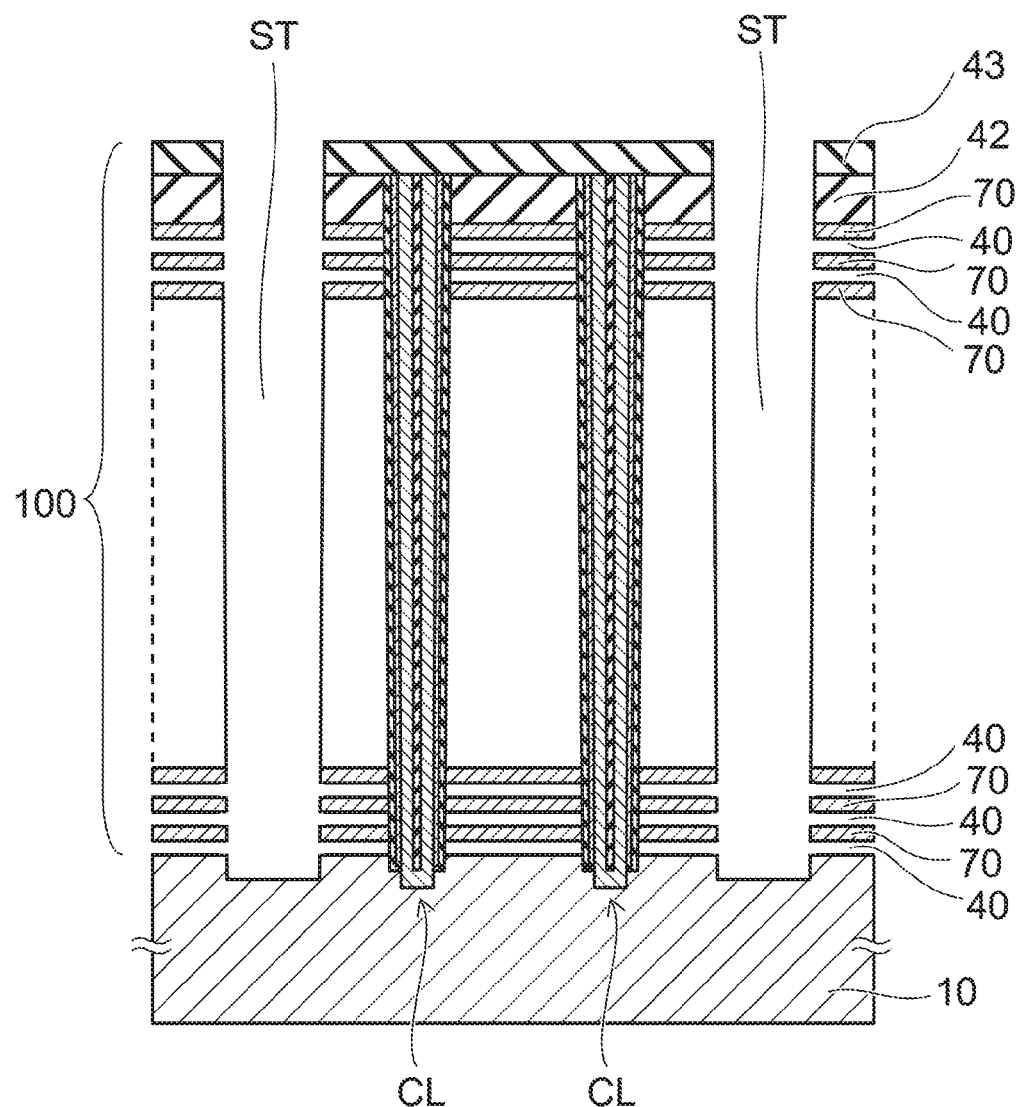
Figure 20A:
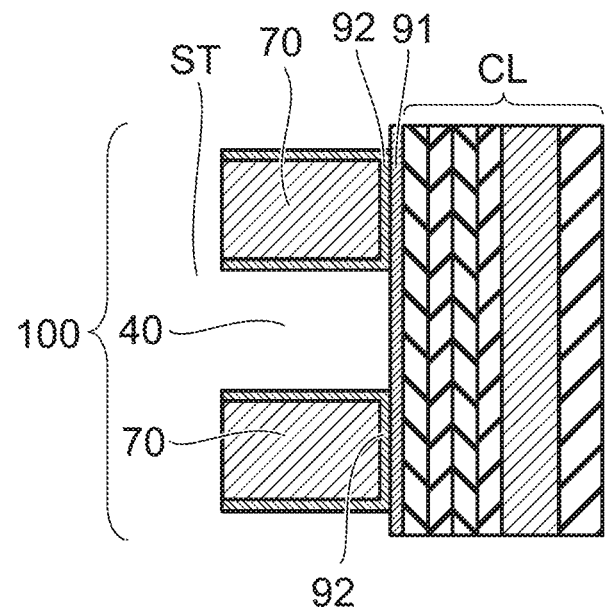

As shown in FIG. 14 and FIG. 20A, the air gap 40 is formed between the metal layers 70 adjacent above and blow by removing the second layer 72. As shown in FIG. 14, the air gap 40 is also formed between the substrate 10 and the lowermost metal layer 70. The plurality of metal layers 70 stacked with the air gap 40 are supported by the columnar sections CL.

As shown in FIG. 20A, the first metal nitride film 91 is exposed to the air gap 40. The second metal nitride film 92 formed on the upper surface of the metal layer 70 and the second metal nitride film 92 formed on the lower surface of the metal layer 70 are exposed to the air gap 40.

Figure 20B:
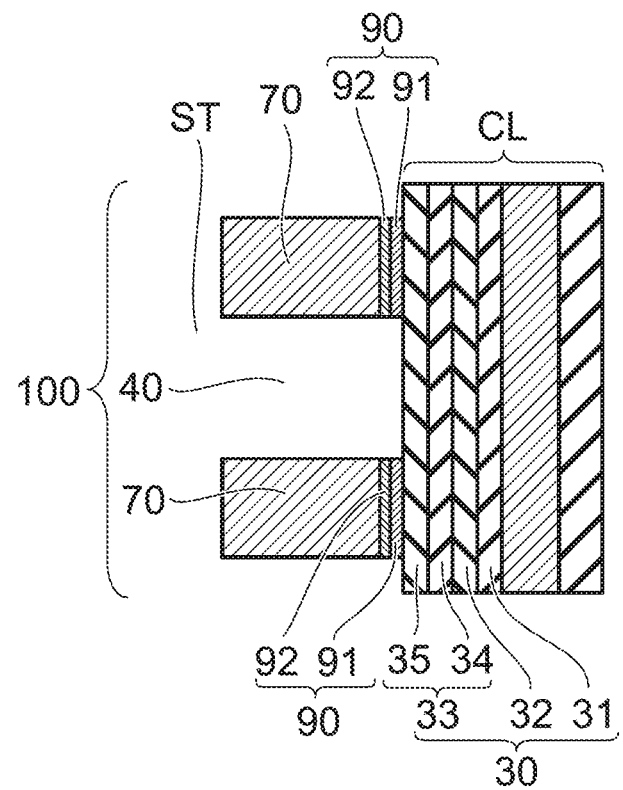

Next, the etching solution or the etching gas is supplied to the air gap 40 through the slit ST, and the first metal nitride film 91 exposed to the air gap 40 is etched. A portion exposed to the air gap 40 of the first metal nitride film 91 is removed and as shown in FIG. 20B, the first metal nitride film 91 is divided in the stacking direction of the stacked body 100. By dividing the first metal nitride film 91, electrical connection through the first metal nitride film 91 between the metal layers 70 adjacent above and below is isolated. Electrical connection through the first metal nitride film 91 between the substrate 10 and the lowermost metal layer 70 is also isolated.

When the second metal nitride film 92 is a film of the same material as the first metal nitride film 91, in etching of dividing the first metal nitride film 91, the second metal nitride film 92 formed on the upper surface and the lower surface of the metal layer 70 is also removed as shown in FIG. 20B.

When the second metal nitride film 92 is a film of a different material from the first metal nitride film 91, in another etching step of dividing the first metal nitride film 91, the second metal nitride film 92 formed on the upper surface and the lower surface of the metal layer 70 can be removed.

The second metal nitride film 92 formed on the upper surface and the lower surface of the metal layer 70 may be left without removal.

Figure 15:
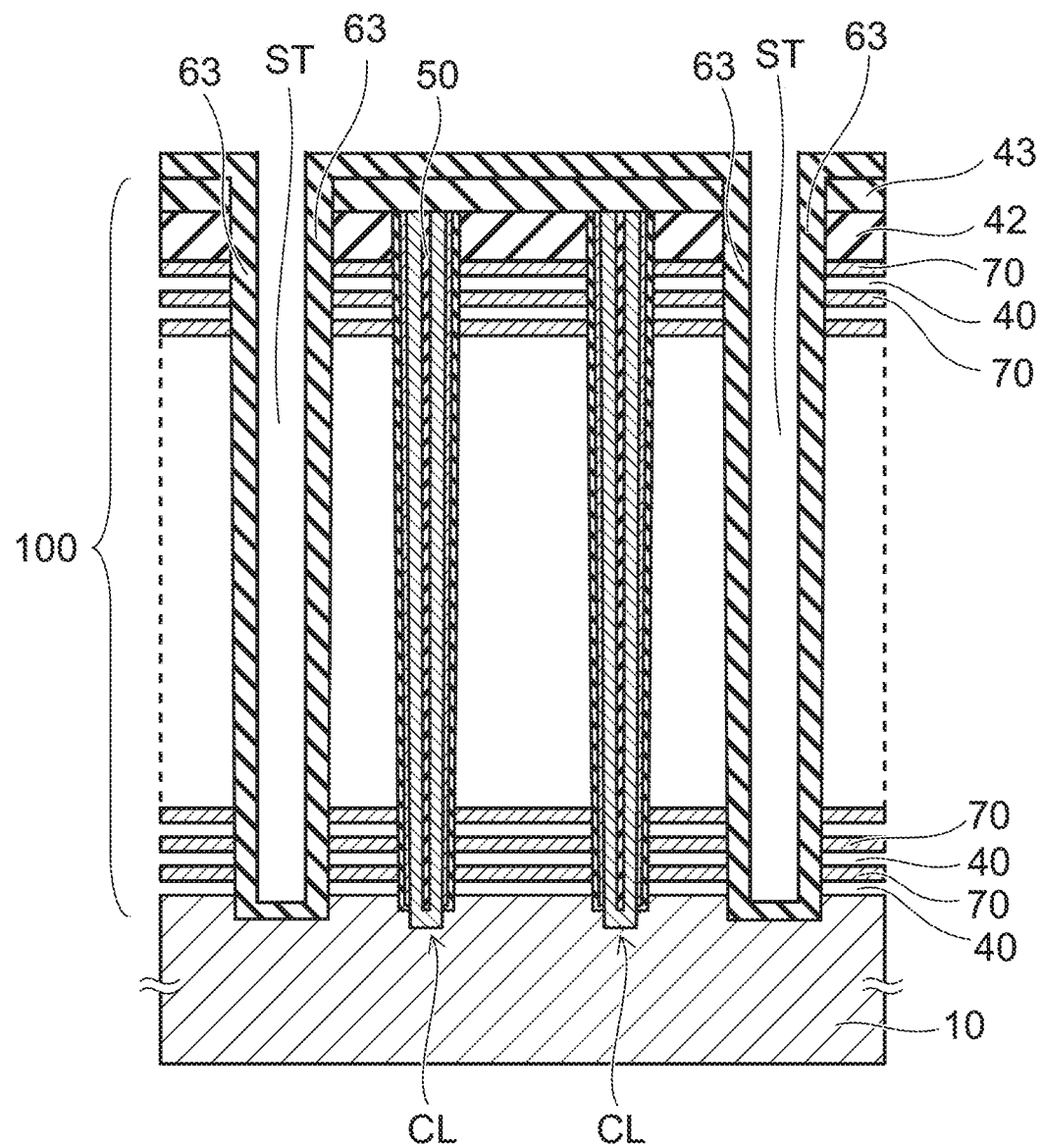

As shown in FIG. 15, the insulating film 63 is formed on the side surface and the bottom of the slit ST after dividing the first metal nitride film 91. The insulating film 63 with a low coverage blocks an opening of the air gap 40 on the slit ST side. The air gap 40 is not buried with the insulating film 63.

After removing the insulating film 63 formed on the bottom of the slit ST by the RIE method, the interconnect section LI is buried in the slit ST as shown in FIG. 2. The lower end of the interconnect section LI is connected to the substrate 10. After that, the bit line BL and the source line SL or the like shown in FIG. 1 are formed.

Next, a further detailed example of a formation method of the metal layer 70 will be described.

For example, the tungsten layer or the molybdenum layer is formed as the metal layer 70 by the CVD method. The gas at CVD is supplied to the air gap 44 shown in FIG. 18A through the slit ST.

It may be very difficult to form the tungsten layer and the molybdenum layer with high adhesiveness by the CVD method on insulating films such as the second layer 72 and the block insulating film 33. Then, according to the embodiment, the metal layer (tungsten layer or molybdenum layer) 70 is formed in the air gap 44 by using the metal nitride film 90 having a metal crystal structure as a seed layer.

The process of forming, for example, the tungsten layer as the metal layer 70 by the CVD method includes a process of forming a tungsten initial film with low crystallinity or microcrystal on a surface of the metal nitride film 90, and a process of forming a tungsten layer with a thickness thicker than the initial film and with a large grain diameter inside the initial film.

The initial film is formed, for example, by a reaction of tungsten fluoride ($WF_6$) gas which is a source gas of tungsten with diborane ($B_2H_6$) gas which is a reducing gas. After forming the initial film, the $WF_6$ gas reacts with hydrogen ($H_2$) gas which is a reducing gas, and the tungsten layer is formed inside the initial film 70.

The molybdenum layer as the metal layer 70 can be formed by using, for example, $MoF_6$ gas as the source gas, by the CVD method, furthermore by using the reducing gas similar to the CVD of the tungsten layer.

The initial film is formed on the surface of the metal nitride film 90 in an initial film formation of the metal layer (tungsten layer or molybdenum layer) 70, and thus crystallinity of tungsten or molybdenum formed inside the initial film and crystallinity of the metal nitride film 90 can be divided. The crystallinity of the metal nitride film 90 does not influence the crystallinity of the metal layer 70. This promotes a grain diameter of tungsten or molybdenum to become large due to the $H_2$ reduction reaction, and decreases a resistance of the metal layer 70.

The metal layer (tungsten layer or molybdenum layer) 70 formed by the CVD method using the previously described gas takes in fluorine and boron. If the fluorine and boron diffuse into the block insulating film 33 by heat process after forming the metal layer 70, characteristics of the block insulating film 33 may be degraded.

According to the embodiment, as shown in FIG. 20B, the metal nitride film 90 provided between the metal layer 70 and the block insulating film 33 prevents diffusion of fluorine and boron from the metal layer 70 to the block insulating film 33.

The metal nitride film 90 provided between the metal layer 70 and the block insulating film 33 is desired to have a thickness sufficient for preventing the diffusion of fluorine and boron. On the other hand, if the metal nitride film 92 used as the seed of the metal layer 70 is too thick, a thickness of the metal layer 70 is thin. In FIG. 18A, with increasing a thickness of the metal nitride film 92 without changing a distance between the second layers 72 adjacent above and below, the metal layer 70 formed inside the metal nitride film 92 is thinner. Thinning the metal layer 70 leads resistance increase.

According to the embodiment, the metal nitride film 90 is formed in separated two steps. First, the first metal nitride film 91 is formed on the side surface of the memory hole MH, furthermore the columnar section CL is formed, and then the first layer 71 is removed to form the air gap 44. As shown in FIG. 18A, the second metal nitride film 92 is formed in the air gap 44. The second metal nitride film 92 is sufficient to be able to grow the metal layer 70 in crystal, and may be a film neglecting a barrier property.

After that, the previously described process is proceeded, and finally, as shown in FIG. 20B, the metal nitride film 90 including the first metal nitride film 91 and the second metal nitride film 92 is left between the metal layer 70 and the block insulating film 33. The film thickness of the metal nitride film 90 is thicker than the film thickness of the second metal nitride film 92.

Therefore, according to the embodiment, thickening of the metal layer 70 by thinning the second metal nitride film 92 and thickening the metal nitride film 90 between the metal layer 70 and the block insulating film 33 are compatible.

Next, the specific example will be described, where a first titanium nitride film is formed as the first metal nitride film 91 and a second titanium nitride film is formed as the second metal nitride film 92.

The first titanium nitride film and the second titanium nitride film are formed, for example, by a CVD method using titanium chloride ($TiCl_4$) gas as the source gas of titanium, and ($NH_3$) gas as the reducing gas. Chlorine is taken into the first titanium nitride film and the second titanium nitride film.

By controlling the CVD condition, a chlorine concentration of the second titanium nitride film is made higher than a chlorine concentration of the first titanium nitride film. For example, the chlorine concentration can be higher by decreasing the temperature of the CVD.

The titanium nitride film having a high chlorine concentration can increase an etching selection ratio of titanium nitride to tungsten or molybdenum, in etching the titanium nitride film using an etching solution containing phosphoric acid or a gas containing chlorine ($Cl_2$).

Therefore, when the second metal nitride film 92 formed on the side surface of the second layer 72 on the slit ST side shown in FIG. 19A is etched, the second metal nitride film (second titanium nitride film) 92 having a high chlorine concentration can suppress an etching consumption amount of the metal layer 70 from the slit ST side. This suppresses the resistance increase due to volume decrease of the metal layer 70.

The first metal nitride film (first titanium nitride film) 91 has a lower chlorine concentration and a lower etching rate than the second metal nitride film (second titanium nitride film) 92. For that reason, in the process shown in FIG. 20A, when the first metal nitride film (first titanium nitride film) 91 exposed to the air gap 40 is etched, side etching in an extending direction of the first metal nitride film (first titanium nitride film) 91 can be suppressed. Therefore, it becomes easy to leave sufficient amount of first metal nitride film (first titanium nitride film) 91 between the metal layer 70 and the block insulating film 33.

Next, FIG. 21A to FIG. 22B are schematic cross-sectional views showing other specific example of the method for manufacturing the semiconductor device of the embodiment.

Figure 21A:
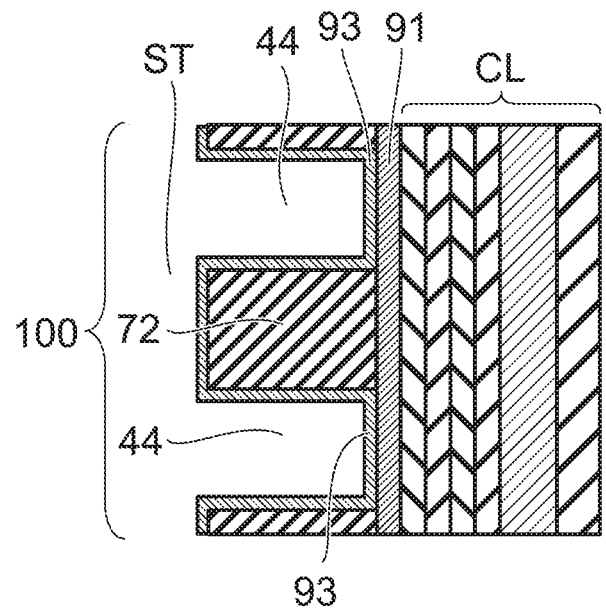

As well as the previously described embodiment, the memory hole MH is formed in the stacked body 100 including the first layer 71 and the second layer 72, and the columnar section CL is formed in the memory hole MH via the metal nitride film 91. After that, the slit ST is formed in the stacked body 100, the first layer 71 is removed by etching through the slit ST, and the air gap 44 is formed as shown in FIG. 21A. A silicon film 93 is formed in the air gap 44.

The silicon film 93 is formed on the side surface of the metal nitride film 91, the upper surface and the lower surface of the second layer 72. The side surface of the metal nitride film 91, the upper surface and the lower surface of the second layer 72 are exposed to the air gap 44. Furthermore, the silicon film 93 is also formed on the side surface, which exposes to the slit ST, of the second layer 72. That is, the silicon film 93 is continuously formed in a conformal form along the side surface, the upper and lower surfaces of the second layer 72, and the side surface of the metal nitride film 91.

The metal nitride film 91 is a film of the previously described material, and has a function to prevent the diffusion of fluorine and boron contained in the metal layer 70. The silicon film 93 functions as a seed layer when forming the tungsten layer or molybdenum layer as the metal layer 70 by the CVD method.

The metal nitride film 91 has a sufficient film thickness to prevent the diffusion of fluorine and boron as a barrier metal film by itself, and is thicker than the silicon film 93.

Figure 21B:
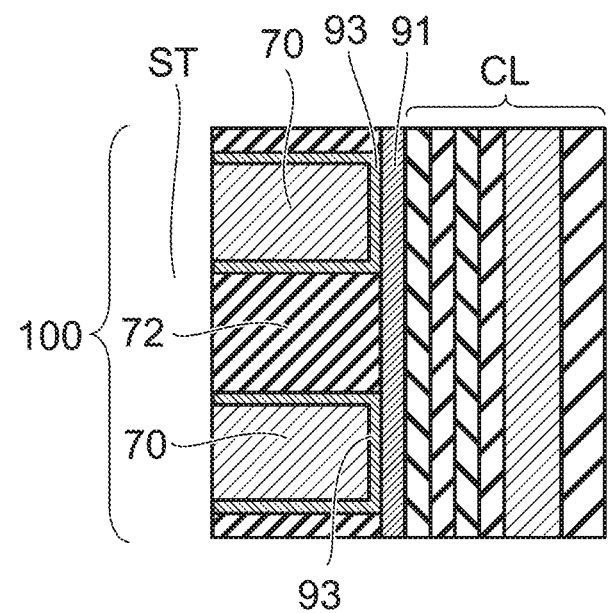

After forming the silicon film 93, the metal layer 70 is formed in the air gap 44 inside the silicon film 93. After that, the metal layer 70 formed on the side surface of the slit ST is removed, and furthermore the silicon film 93 formed on the side surface of the second layer 72 on the slit ST side is removed (FIG. 21B).

Figure 22A:
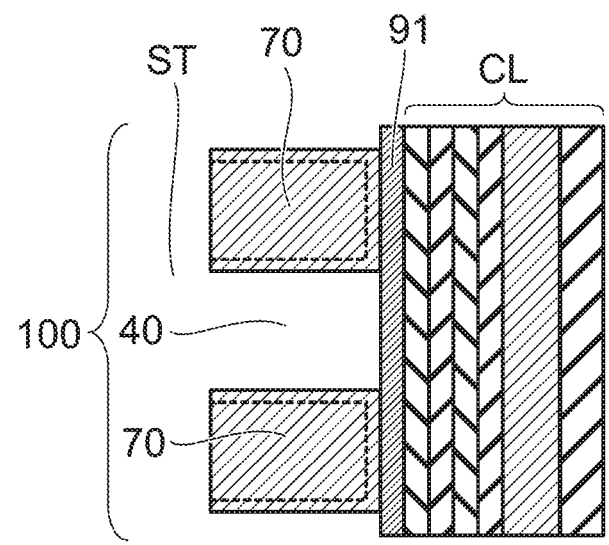

After that, the second layer 72 is removed by etching through the slit ST, and as shown in FIG. 22A, the air gap 40 is formed between the metal layers 70 adjacent above and below. The metal nitride film 91 is exposed to the air gap 40.

Some of silicon in the silicon film 93 reacts with tungsten or molybdenum in the metal layer 70 to form tungsten silicide or molybdenum silicide in CVD forming the metal layer (tungsten layer or molybdenum layer) 70 or a later heat treatment. Some silicon in the silicon film 93 reacts with fluorine in the metal layer 70 to volatilize as silicon fluoride outside the stacked body 100 through the slit ST in the CVD forming the metal layer (tungsten layer or molybdenum layer) 70 or the later heat treatment. A portion of which silicon detaches becomes tungsten or molybdenum.

Therefore, portions where the silicon film 93 is formed are reformed to regions of tungsten or molybdenum containing metal silicide. Since the reformed portions from such the silicon film 93 have higher resistivity than the metal layer 70 formed by crystal growth with a large grain size by way of the initial film as previously described, the silicon film 93 may be thin so as to enable the initial film of the metal layer 70 to form.

Figure 22B:
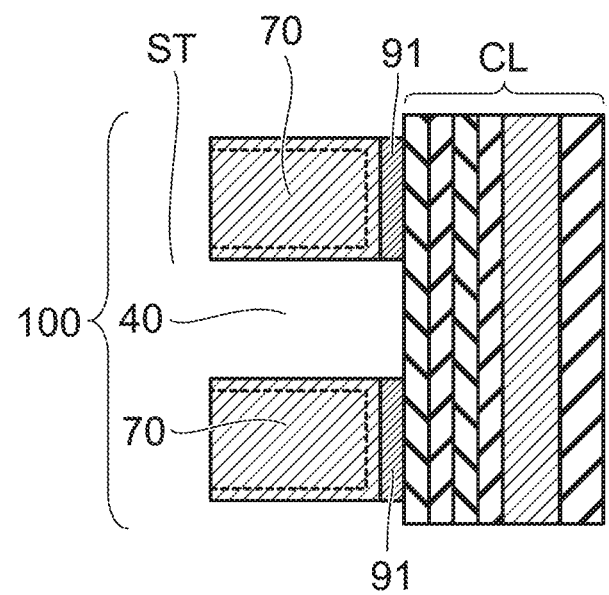

After that, the metal nitride film 91 exposed to the air gap 40 is removed by etching, and as shown in FIG. 22B, the metal nitride film 91 is divided in the stacking direction of the stacked body 100.

The silicon film 93 is sufficiently to be able to grow a crystal of the metal layer 70, and may be a film in defiance of barrier characteristics. On the other hand, the metal nitride film 91 between the metal layer 70 and the block insulating film 33 has a sufficient thickness for prevention of diffusion of fluorine and boron.

Therefore, also in the examples shown in FIG. 21A to FIG. 22B, thickening of the metal layer 70 by thinning of the silicon film 93 and thickening of the metal nitride film 91 between the metal layer 70 and the block insulating film 33 are compatible.

Figure 23:
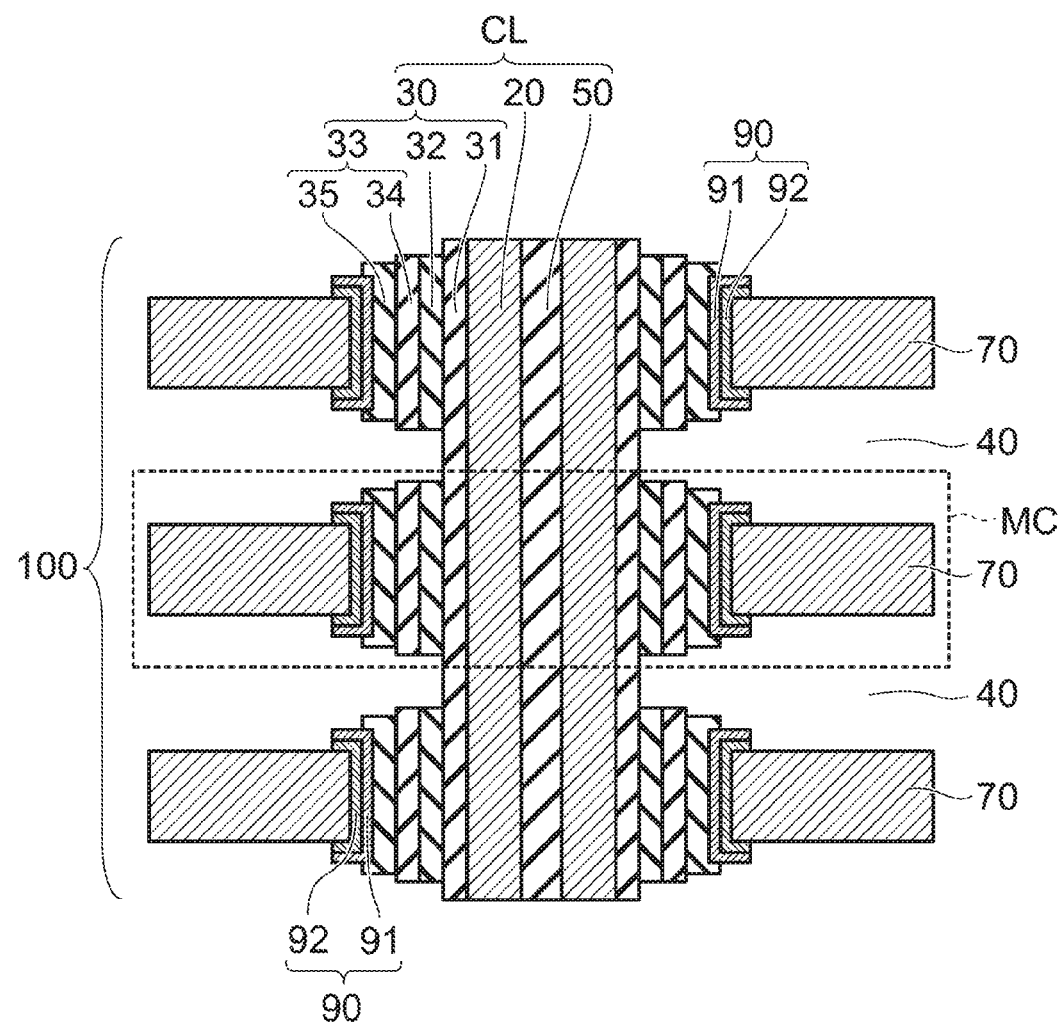
FIG. 23 is a schematic cross-sectional view of a memory cell of one other embodiment.

Next, FIG. 23 is a schematic cross-sectional view of other specific example of the memory cell MC of the semiconductor device of the embodiment.

In the example shown in FIG. 23, the charge storage film 32, the first block film 34, and the second block film 35 are divided into the stacking direction of the stacked body 100.

The air gap 40 between the metal layers 70 adjacent above and below extends to the semiconductor body 20 side so as to divide the second block film 35, the first block film 34, and the charge storage film 32 in the stacking direction. The side surface of the semiconductor body 20 is covered with the tunnel insulating film 31 and not exposed to the air gap 40.

Since the charge storage film 32 is isolated in the stacking direction, a charge stored in the charge storage film 32 does not be released in the stacking direction, and charge retention characteristics of the memory cell MC are excellent.

The metal nitride film 90 covers a corner between the side surface of the metal layer 70 on the columnar section CL side and the upper surface of the metal layer 70, and a corner between the side surface of the metal layer 70 on the columnar section CL side and the lower surface of the metal layer 70.

FIG. 24A to FIG. 29B are schematic cross-sectional views showing a method for manufacturing the semiconductor device shown in FIG. 23.

Figure 24A:
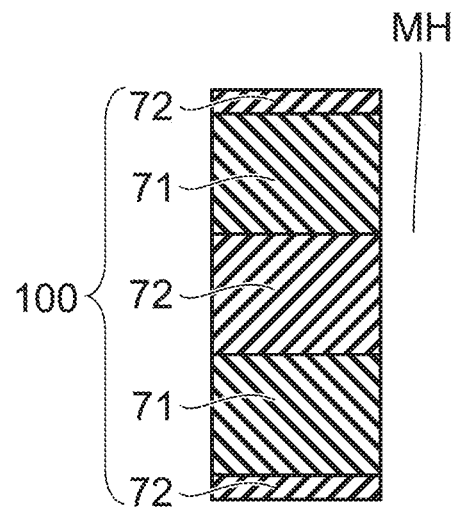
FIG. 24A to FIG. 29B are schematic cross-sectional views showing a method for manufacturing a semiconductor device of the one other embodiment.

Similarly to the previously described embodiment, as shown in FIG. 24A, the memory hole MH is formed in the stacked body 100 including a plurality of first layers 71 and a plurality of second layers 72.

Figure 24B:
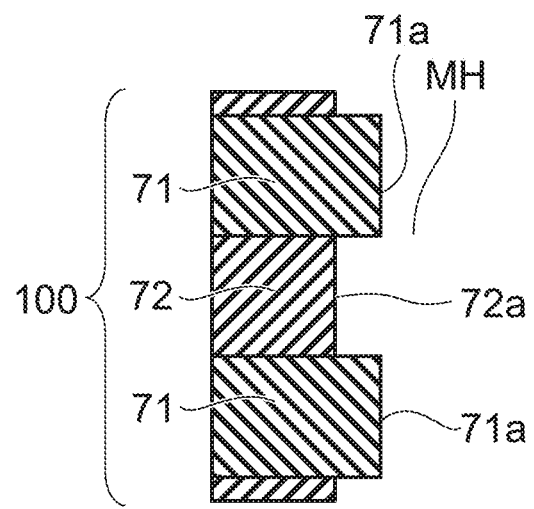

After that, by etching through the memory hole MH, as shown in FIG. 24B, a side surface 72a of the second layer 72 on the memory hole MH side is receded from a side surface 71a of the first layer 71 on the memory hole MH side. In the memory hole MH, a diameter of a portion surrounded by the second layer 72 becomes larger than a diameter of a portion surrounded by the first layer 71.

Figure 25A:
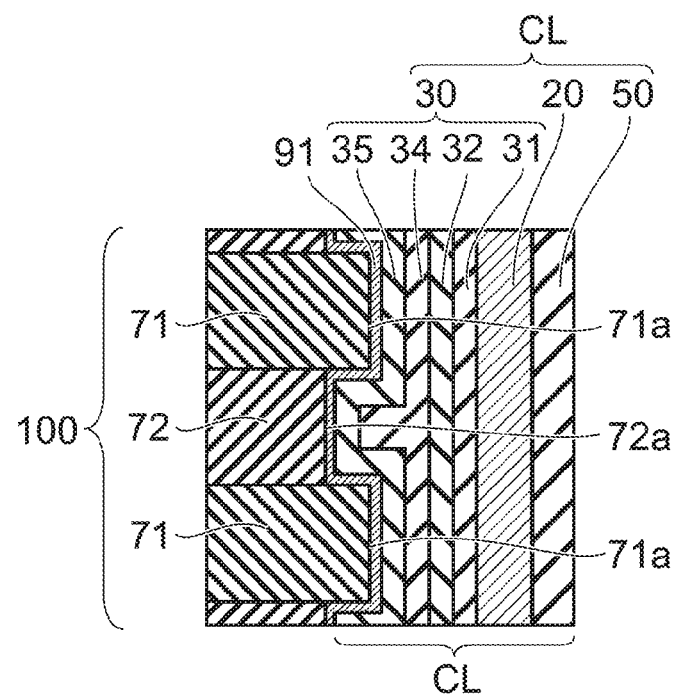

Since the side surface 72a of the second layer 72 is receded, a step is formed between the side surface 71a of the first layer 71 and the side surface 72a of the second layer 72. As shown in FIG. 25A, the first metal nitride film 91 and the second block film 35 are formed sequentially along the step.

The first metal nitride film 91 and the second block film 35 are formed in a conformal form along the side surface 71a of the first layer 71 on the columnar section CL side, the upper and lower surfaces of the first layer 71 continuing from the side surface 71a by way of the corner, and the side surface 72a of the second layer 72 on the columnar section CL side.

A hollow recess from the memory hole MH side is formed in a portion of the second block film 35 opposing to the second layer 72. A part of the first block film 34 is buried in the recess and protrudes into the recess. In the example shown in FIG. 25A, the step between the side surface 71a of the first layer 71 and the side surface 72a of the second layer 72 is not reflected to the charge storage film 32, the tunnel insulating film 31, the semiconductor body 20, and the core film 50. The charge storage film 32, the tunnel insulating film 31, the semiconductor body 20, and the core film 50 are formed to extend in the stacking direction with a substantive uniform film thickness.

Figure 25B:
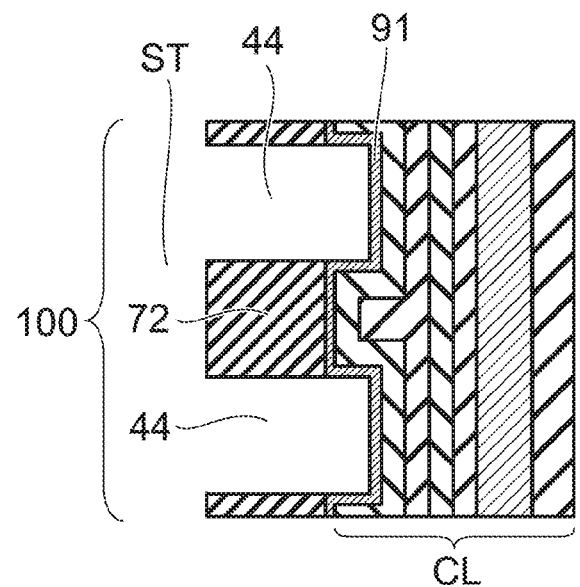

After forming the columnar section CL in the memory hole MH, the first layer 71 is removed by the etching through the slit ST, and the air gap 44 is formed as shown in FIG. 25B. The first metal nitride film 91 is exposed to the air gap 44.

Figure 26A:
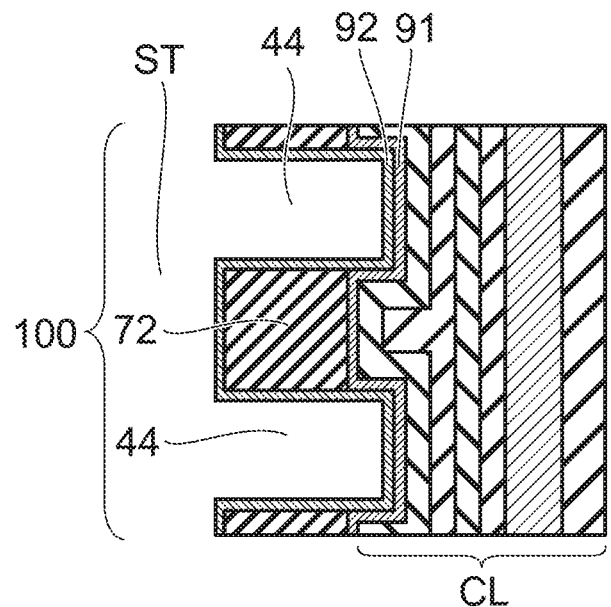

As shown in FIG. 26A, the second metal nitride film 92 is formed in the air gap 44. The second metal nitride film 92 is also formed on the side surface of the first metal nitride film 91 and the upper and lower surfaces of the second layer 72. The side surface of the first metal nitride film 91, and the upper and lower surfaces of the second layer 72 are exposed to the air gap 44. Furthermore, the second metal nitride film 92 is also formed on the side surface of the second layer 72 exposed to the slit ST. That is, the second metal nitride film 92 is continuously formed in a conformal form along the side surface, the upper and lower surfaces of the second layer 72, and the side surface of the first metal nitride film 91.

Figure 26B:
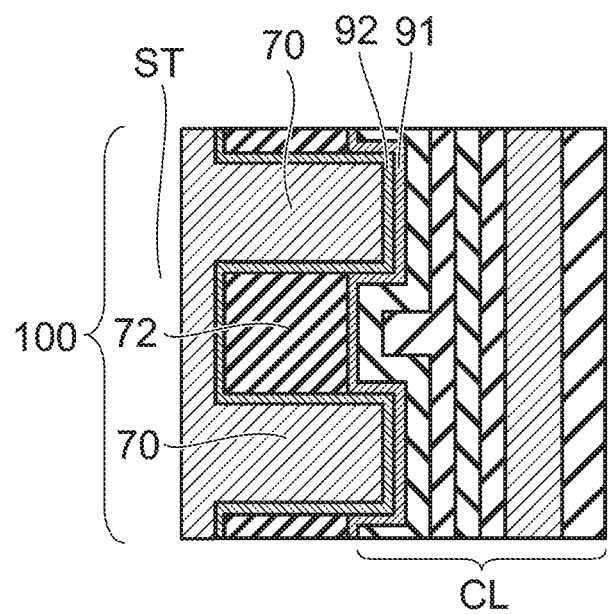
Figure 27A:
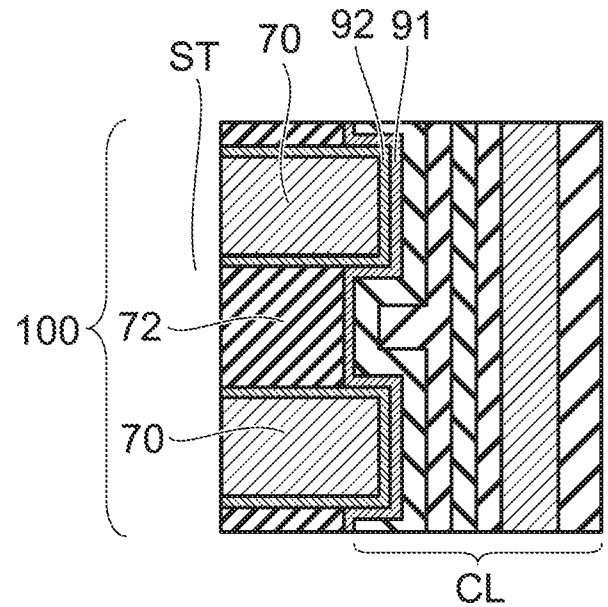

After that, as shown in FIG. 26B, the metal layer 70 is formed in the air gap 44. After that, the metal layer 70 formed on the side surface of the slit ST is removed, furthermore the second metal nitride film 92 formed on the side surface of the second layer 72 on the slit ST side is removed, and as shown in FIG. 27A, the side surface of the second layer 72 is exposed to the slit ST.

Figure 27B:
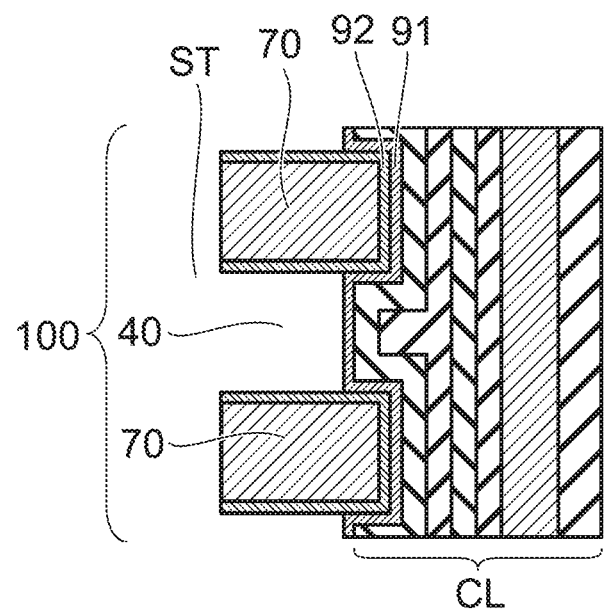

Next, the second layer 72 is removed by the etching solution or the etching gas supplied through the slit ST. As shown in FIG. 27B, the air gap 40 is formed between the metal layers 70 adjacent above and below by removing the second layer 72.

Figure 28A:
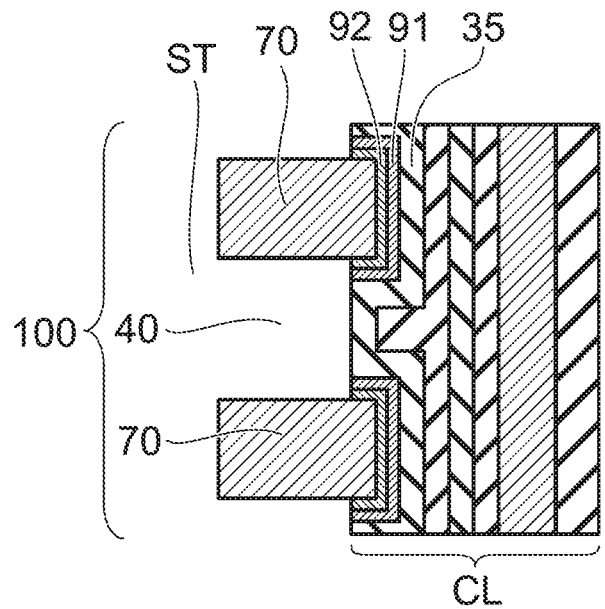

Next, the etching solution or the etching gas is supplied to the air gap 40 through the slit ST, and the first metal nitride film 91 exposed to the air gap 40 is etched. A portion of the first metal nitride film 91 exposed to the air gap 40 is removed, and as shown in FIG. 28A, the first metal nitride film 91 is divided in the stacking direction of the stacked body 100. Electrical connection between the metal layers 70 adjacent above and below through the first metal nitride film 91 is divided.

The first metal nitride film 91 exposed to the air gap 40 is removed, and as shown in FIG. 28A, a part of the second block film 35 is exposed to the air gap 40. Next, the etching solution or the etching gas is supplied to the air gap 40 through the slit ST, and the second block film 35 exposed to the air gap 40 is etched. A portion of the second block film 35 exposed to the air gap 40 is removed, and as shown in FIG. 28B, the second block film 35 is divided in the stacking direction of the stacked body 100.

Figure 28B:
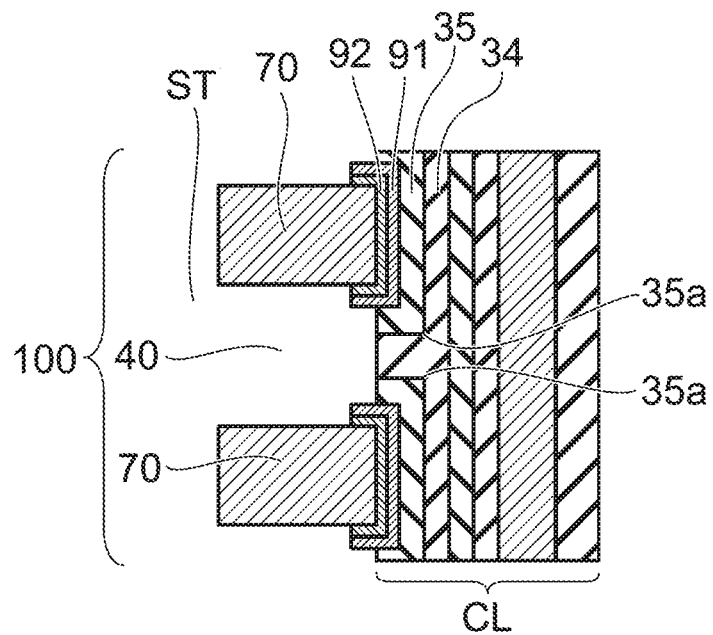

A part of the second block film 35 exposed to the air gap 40 is removed, and as shown in FIG. 28B, a part of the first block film 34 is exposed to the air gap 40. Next, the etching solution or the etching gas is supplied to the air gap 40 through the slit ST, and the first block film 34 exposed to the air gap 40 is etched. A portion of the first block film 34 exposed to the air gap 40 is removed, and as shown in FIG. 29A, the first block film 34 is divided in the stacking direction of the stacked body 100.

Figure 29A:
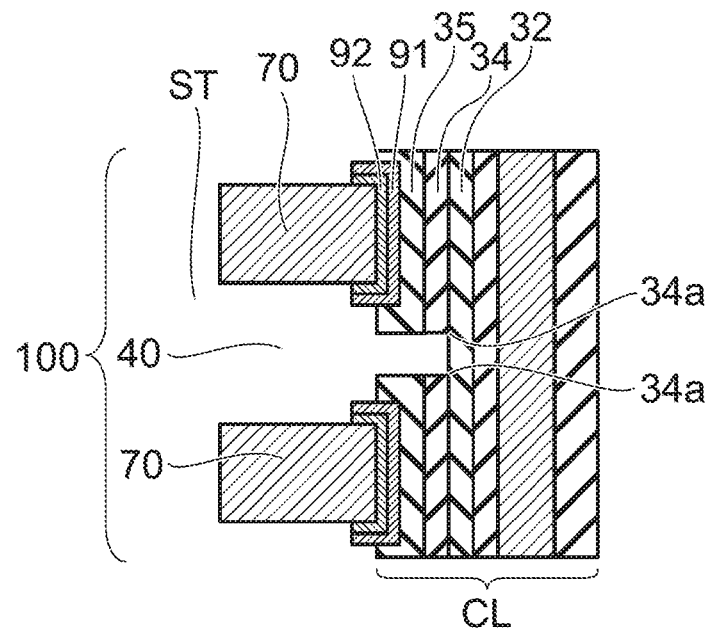
Figure 29B:
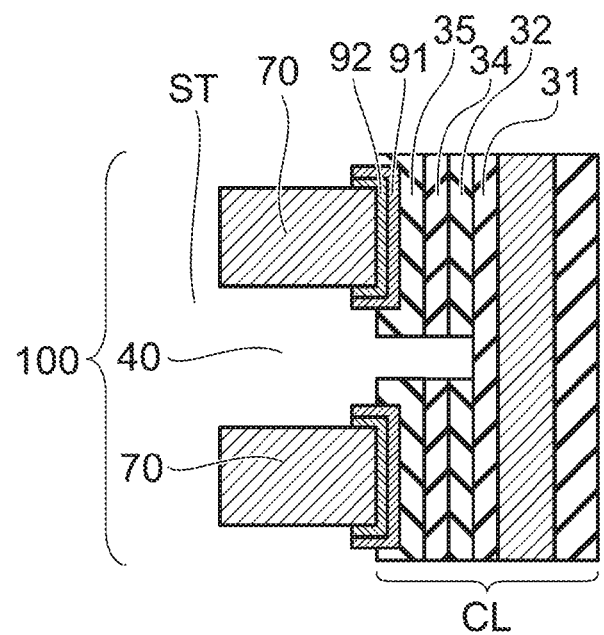

A part of the first block film 34 exposed to the air gap 40 is removed, and as shown in FIG. 29A, a part of the charge storage film 32 is exposed to the air gap 40. Next, the etching solution or the etching gas is supplied to the air gap 40 through the slit ST, and the charge storage film 32 exposed to the air gap 40 is etched. A portion of the charge storage film 32 exposed to the air gap 40 is removed, and as shown in FIG. 29B, the charge storage film 32 is divided in the stacking direction of the stacked body 100.

After that, similar processes to the previously described embodiment are progressed, such as process of forming the interconnect section LI in the slit ST via the insulating film 63.

According to this embodiment, as shown in FIG. 25A, the second block film 35 and the first block film 34 can be formed to cause to enter the region where the side surface 72a of the second layer 72 is receded. For that reason, as shown in FIG. 28B, the second block film 35 can be divided in a state where the second block film 35 is left so as to cover the corner of the metal layer 70 on the columnar section CL side. Consequently, the second block film 35 can be left surely in the region opposing to the side surface of the metal layer 70.

In the process of etching the first block film 34 exposed to the air gap 40 in the process shown in FIG. 28B, after disappearance of a portion interposed between the second block film 35, etching of the first block film 34 proceeds isotropically from a start point of a corner 35a of the second block film 35, and as shown in FIG. 29A, the first block film 34 is divided.

Because of the isotropic etching from the start point of the corner 35a of the second block film 35, the first block film 34 is also etched slightly in a vertical direction. The etching start point is not proximal to the side surface of the metal layer 70. There is a distance between the etching start point and a portion of the first block film 34 opposing to the side surface of the metal layer 70. The distance is desirable to be not less than a film thickness of the first block film 34.

For that reason, before the etching proceeds to the portion of the first block film 34 opposing to the side surface of the metal layer 70, the first block film 34 can be divided in the vertical direction. Otherwise, an etching consumption amount of the portion of the first block film 34 opposing to the side surface of the metal layer 70 before completing the division in the vertical direction of the first block film 34 can be suppressed. While a sufficient amount of the first block film 34 is left on the portion opposing to the side surface of the metal layer 70, the first block film 34 can be divided in the vertical direction.

The etching of the charge storage film 32 exposed to the air gap 40 in the process shown in FIG. 29A, is proceeded isotropically from the start point of the corner 34a of the firs block film 34 proximal to the air gap 40 and the charge storage film 32. Then, as shown in FIG. 29B, the charge storage film 32 is divided.

Because of the isotropic etching from the start point of the corner 34a of the first block film 34, the charge storage film 32 is also etched slightly in the vertical direction. The etching start point is not proximal to the side surface of the metal layer 70, and there is a distance between the etching start point and a portion of the charge storage film 32 opposing to the side surface of the metal layer 70. The distance is desirable to be not less than a film thickness of the charge storage film 32.

For that reason, before the etching proceeds to the portion of the charge storage film 32 opposing to the side surface of the metal layer 70, the charge storage film 32 can be divided in the vertical direction. Otherwise, an etching consumption amount of the portion of the charge storage film 32 opposing to the side surface of the metal layer 70 before completing the division in the vertical direction of the charge storage film 32 can be suppressed. While a sufficient amount of the charge storage film 32 is left on the portion opposing to the side surface of the metal layer 70, the charge storage film 32 can be divided in the vertical direction.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without depart-ing from the spirit of the inventions. The accompanying claims and their equivalents are intended to cover such forms or modifications as would fall within the scope and spirit of the invention.

What is claimed is:

1. A method for manufacturing a semiconductor device comprising:
    forming a stacked body above a substrate, the stacked body including a plurality of first layers and a plurality of second layers, the first layers and the second layers including a first layer and a second layer alternately stacked;
    forming a first metal nitride film on a side surface of a hole extending in a stacking direction in the stacked body;
    forming a stacked film including a charge storage portion on a side surface of the first metal nitride film;
    forming a semiconductor body on a side surface of the stacked film;
    removing the first layers and forming a plurality of first air gaps between the second layers;
    forming a second metal nitride film on upper and lower surfaces of the second layers and a side surface of the first metal nitride film, the upper and lower surfaces of the second layers and the side surface of the first metal nitride film being exposed to the first air gaps;
    forming a plurality of metal layers in the first air gaps inside the second metal nitride film;
    removing the second layers and forming a plurality of second air gaps between the metal layers; and
    removing the first metal nitride film exposed to the second air gaps and dividing the first metal nitride film in the stacking direction.

2. The method for manufacturing the semiconductor device according to claim 1, wherein
    the first metal nitride film and the second metal nitride film contain at least one of titanium nitride, titanium silicide nitride, tantalum nitride, tantalum silicide nitride, tungsten nitride, tungsten silicide nitride, molybdenum nitride, and molybdenum silicide nitride.

3. The method for manufacturing the semiconductor device according to claim 1, wherein
    removing the first layers, forming the second metal nitride film, forming the metal layers, removing the second layers, and removing the first metal nitride film are performed through a slit formed in the stacked body.

4. The method for manufacturing the semiconductor device according to claim 3, wherein
    when the second metal nitride film is formed, the second metal nitride film is also formed on side surfaces of the second layers continuously to the upper and lower surfaces of the second layers, the side surfaces of the second layers being exposed to the slit, and
    the second metal nitride film formed on the side surface of the second layers is removed by etching through the slit.

5. The method for manufacturing the semiconductor device according to claim 4, wherein
    a first titanium nitride film is formed as the first metal nitride film by using a gas containing titanium chloride, and a second titanium nitride film is formed as the second metal nitride film by using a gas containing titanium chloride, and
    a chlorine concentration of the second titanium nitride film is higher than a chlorine concentration of the first titanium nitride film.

6. The method for manufacturing the semiconductor device according to claim 1, further comprising:

after removing the first metal nitride film exposed to the second air gaps, etching the charge storage portion through the second air gaps, and dividing the charge storage portion in the stacking direction.

7. The method for manufacturing the semiconductor device according to claim 6, further comprising:
   receding side surfaces of the second layers on a side of the hole from side surfaces of the first layers on the side of the hole, and forming steps between the side surfaces of the first layers and the side surfaces of the second layers,
   at least a part of the stacked film being formed along the steps.

8. The method for manufacturing the semiconductor device according to claim 1, wherein
   tungsten layers or molybdenum layers are formed as the metal layers by a CVD method using a source gas containing tungsten fluoride or molybdenum fluoride, and a reducing gas containing boron.

9. The method for manufacturing the semiconductor device according to claim 1, wherein
   the first layers are silicon nitride layers, and the second layers are silicon oxide layers, and
   the silicon nitride layers are removed by using an etching solution containing phosphoric acid, and the silicon oxide layers are removed by using an etching solution containing hydrofluoric acid.

10. A method for manufacturing a semiconductor device comprising:
    forming a stacked body above a substrate, the stacked body including a plurality of first layers and a plurality of second layers, the first layers and the second layers including a first layer and a second layer alternately stacked;
    forming a metal nitride film on a side surface of a hole extending in a stacking direction in the stacked body;
    forming a stacked film including a charge storage portion on a side surface of the metal nitride film;
    forming a semiconductor body on a side surface of the stacked film;
    removing the first layers and forming a plurality of first air gaps between the second layers;
    forming a silicon film on upper and lower surfaces of the second layers and a side surface of the metal nitride film, the upper and lower surfaces of the second layers and the side surface of the metal nitride film being exposed to the first air gaps;
    forming a plurality of metal layers in the first air gaps inside the silicon film;
    removing the second layers and forming a plurality of second air gaps between the metal layers; and
    removing the metal nitride film exposed to the second air gaps and dividing the metal nitride film in the stacking direction.

11. The method for manufacturing the semiconductor device according to claim 10, wherein
    the metal nitride film contains at least one of titanium nitride, titanium silicide nitride, tantalum nitride, tantalum silicide nitride, tungsten nitride, tungsten silicide nitride, molybdenum nitride, and molybdenum silicide nitride.

12. The method for manufacturing the semiconductor device according to claim 10, wherein
    the metal nitride film is thicker than the silicon film.

13. The method for manufacturing the semiconductor device according to claim 10, wherein
    removing the first layers, forming the silicon film, forming the metal layers, removing the second layers, and removing the metal nitride film are performed through a slit formed in the stacked body.

14. The method for manufacturing the semiconductor device according to claim 10, further comprising:
    after removing the metal nitride film exposed to the second air gap, etching the charge storage portion through the second air gaps, and dividing the charge storage portion in the stacking direction.

15. The method for manufacturing the semiconductor device according to claim 14, further comprising:
    receding side surfaces of the second layers on a side of the hole from side surfaces of the first layers on the side of the hole, and forming steps between the side surfaces of the first layers and the side surfaces of the second layers,
    at least a part of the stacked film being formed along the steps.

16. The method for manufacturing the semiconductor device according to claim 10, wherein
    tungsten layers or molybdenum layers are formed as the metal layers by a CVD method using a source gas containing tungsten fluoride or molybdenum fluoride, and a reducing gas containing boron.

17. The method for manufacturing the semiconductor device according to claim 16, wherein
    tungsten or molybdenum contained in the metal layers is caused to react with silicon of the silicon film, and
    fluorine contained in the metal layers is caused to react with the silicon of the silicon film.

18. The method for manufacturing the semiconductor device according to claim 10, wherein
    the first layers are silicon nitride layers, and the second layers are silicon oxide layers, and
    the silicon nitride layers are removed by using an etching solution containing phosphoric acid, and the silicon oxide layers are removed by using an etching solution containing hydrofluoric acid.

19. A method for manufacturing a semiconductor device comprising:
    forming a stacked body above a substrate, the stacked body including a plurality of first layers and a plurality of second layers, the first layers and the second layers including a first layer and a second layer alternately stacked;
    forming a barrier metal film on a side surface of a hole extending in a stacking direction in the stacked body;
    forming a stacked film including a charge storage portion on a side surface of the barrier metal film;
    forming a semiconductor body on a side surface of the stacked film;
    removing the first layers and forming a plurality of first air gaps between the second layers;
    forming a plurality of metal layers in the first air gaps;
    removing the second layers and forming a plurality of second air gaps between the metal layers; and
    removing the barrier metal film exposed to the second air gaps and dividing the barrier metal film in the stacking direction.

20. The method for manufacturing the semiconductor device according to claim 19, wherein
    tungsten layers or molybdenum layers are formed as the metal layers by a CVD method using a source gas containing tungsten fluoride or molybdenum fluoride, and a reducing gas containing boron, and the barrier metal film is formed of a material preventing diffusion of at least one of fluorine and boron.

* * * * *